United States Patent
Leedom et al.

(10) Patent No.: US 7,113,611 B2
(45) Date of Patent: Sep. 26, 2006

(54) DISPOSABLE MODULAR HEARING AID

(75) Inventors: Marvin A. Leedom, Princeton, NJ (US); Derek D. Mahoney, Manalapan, NJ (US); John M. Margicin, Langhorne, PA (US); Sam Meytus, East Brunswick, NJ (US); Reuben Zielinski, Belle Mead, NJ (US); Frederick Fritz, Skillman, NJ (US); Michael H. Tardugno, Lawrenceville, NJ (US); Walter P. Sjursen, Washington Crossing, PA (US); David A. Preves, Princeton Junction, NJ (US)

(73) Assignee: Sarnoff Corporation, Princeton, NJ (US)

( * ) Notice: Subject to any disclaimer, the term of this patent is extended or adjusted under 35 U.S.C. 154(b) by 349 days.

(21) Appl. No.: 09/804,978

(22) Filed: Mar. 13, 2001

(65) Prior Publication Data

US 2002/0027996 A1    Mar. 7, 2002

Related U.S. Application Data

(63) Continuation-in-part of application No. 09/524,666, filed on Mar. 13, 2000.

(60) Provisional application No. 60/132,593, filed on May 5, 1999, provisional application No. 60/157,873, filed on Oct. 6, 1999.

(51) Int. Cl.
    *H04R 25/00* (2006.01)
(52) U.S. Cl. .................. 381/322; 381/325; 381/328
(58) Field of Classification Search ................ 381/322, 381/324, 325, 327, 328, 330, 380; 181/129–130
    See application file for complete search history.

(56) References Cited

U.S. PATENT DOCUMENTS

| | | | |
|---|---|---|---|
| 2,246,737 A | 6/1941 | Knudsen | 128/152 |
| 2,487,038 A | 11/1949 | Baum | 181/23 |
| 3,047,089 A | 7/1962 | Zwislocki | 181/23 |
| 3,080,011 A | 3/1963 | Henderson | 181/23 |
| 3,527,901 A | 9/1970 | Geib | 179/107 |
| 3,598,928 A | 8/1971 | Hickox | 179/107 E |

(Continued)

FOREIGN PATENT DOCUMENTS

DE    3406972 A1    8/1985

(Continued)

OTHER PUBLICATIONS

Killion, M., "Earmold Plumbing for Wideband Hearing Aids," Paper CC4, 91st Meeting of Acoustical Society of America (Apr. 8, 1976).

(Continued)

*Primary Examiner*—Suhan Ni
(74) *Attorney, Agent, or Firm*—Hamilton, Brook, Smith & Reynolds, P.C.

(57) ABSTRACT

A hearing aid includes a first half shell and a second shell attached to the first shell. A microphone, battery, electronics, a receiver and a flexible tip are mounted within a housing formed by the first half shell and the second half shell. A mechanical securing mechanism, located on the first half shell and the second half shell, attaches the first half shell to the second half shell. A flexible tip for a hearing aid includes a tip portion, a sound port attached to the tip portion and a vent formed in the flexible tip. The vent provides static pressure equilibrium between an ear canal and an ambient pressure.

10 Claims, 44 Drawing Sheets

U.S. PATENT DOCUMENTS

| | | | | |
|---|---|---|---|---|
| 3,852,540 A | 12/1974 | Diethelm | | 179/107 E |
| 3,890,474 A | 6/1975 | Glicksberg | | 179/107 E |
| 3,935,401 A | 1/1976 | Shore et al. | | |
| 4,055,233 A | 10/1977 | Huntress | | 181/135 |
| 4,068,090 A | 1/1978 | Komatsu et al. | | 179/1 A |
| 4,170,720 A | 10/1979 | Killion | | 179/107 R |
| 4,291,203 A | 9/1981 | Bellafiore | | 179/107 R |
| 4,447,677 A | 5/1984 | Miyahra et al. | | 179/107 R |
| 4,607,720 A | 8/1986 | Hardt | | 181/135 |
| 4,622,440 A | 11/1986 | Slavin | | 381/68 |
| 4,716,985 A | 1/1988 | Hartl | | 181/130 |
| 4,736,430 A | 4/1988 | Schröeder | | |
| 4,739,512 A | 4/1988 | Hartl et al. | | |
| 4,800,636 A | 1/1989 | Topholm | | 29/169.5 |
| 4,815,138 A | 3/1989 | Diethelm | | 381/69.2 |
| 4,834,211 A | 5/1989 | Bibby et al. | | |
| 4,840,249 A | 6/1989 | Birkholz et al. | | 181/129 |
| 4,870,688 A | 9/1989 | Voroba et al. | | 381/60 |
| 4,969,534 A | 11/1990 | Kolpe et al. | | 181/130 |
| 5,002,151 A | 3/1991 | Oliveira et al. | | 181/130 |
| 5,008,943 A | 4/1991 | Arndt et al. | | 381/68.6 |
| 5,048,090 A | 9/1991 | Geers | | 381/68.6 |
| 5,062,138 A * | 10/1991 | Schmid | | 381/323 |
| 5,185,802 A | 2/1993 | Stanton | | 381/68.6 |
| 5,347,584 A | 9/1994 | Narisawa | | 381/69.2 |
| 5,606,621 A * | 2/1997 | Reiter et al. | | 381/328 |
| 5,701,348 A | 12/1997 | Shennib et al. | | 381/68.6 |
| 5,724,431 A | 3/1998 | Reiter et al. | | 381/69.2 |
| 5,748,743 A | 5/1998 | Weeks | | 381/68.6 |
| 5,753,870 A | 5/1998 | Schlaegel et al. | | 181/129 |
| 5,784,471 A | 7/1998 | Bebenroth | | 381/69 |
| 5,828,757 A | 10/1998 | Michaelsen et al. | | |
| 5,881,159 A | 3/1999 | Aceti et al. | | 381/328 |
| 5,887,070 A | 3/1999 | Iseberg et al. | | |
| 5,987,146 A | 11/1999 | Pluvinage et al. | | 381/328 |
| 6,022,311 A | 2/2000 | Juneau et al. | | 600/25 |
| 6,097,825 A | 8/2000 | Yoest et al. | | |
| 6,144,750 A | 11/2000 | Levin | | |
| 6,292,572 B1 | 9/2001 | Yoest et al. | | |
| 6,434,248 B1 | 8/2002 | Juneau et al. | | |
| 6,438,244 B1 | 8/2002 | Juneau et al. | | |
| 6,681,021 B1 * | 1/2004 | Saltykov | | 381/328 |

FOREIGN PATENT DOCUMENTS

| | | |
|---|---|---|
| EP | 0 354 698 A2 | 2/1990 |
| EP | 0 782 371 A2 | 7/1997 |
| GB | 1 468 120 | 3/1977 |
| GB | 2 155 276 A | 9/1985 |
| JP | 151100 | 7/1987 |
| WO | WO 93/25053 | 12/1993 |
| WO | WO 97/04619 | 2/1997 |
| WO | WO 97/34443 | 9/1997 |
| WO | WO 99 39548 A | 8/1999 |
| WO | WO 03/015463 A2 | 2/2003 |

OTHER PUBLICATIONS

Killion, M., "Earmold Options for Wideband Hearing Aids," *Journal of Speech and Hearing Disorders*, pp. 10-20 (Feb. 1981).

"SoundChoice Hearing Aids & The PAC System," *Bausch & Lomb* (1990).

"Introducing SoundChoice Ultrasoft III from Bausch & Lomb," *Bausch & Lomb* (1991).

* cited by examiner

DISPOSABLE MODULAR HEARING AID

RELATED APPLICATION

This application is a continuation-in-part of application Ser. No. 09/524,666, filed Mar. 13, 2000, which claims the benefit of U.S. Provisional Application No. 60/132,593, filed May 5, 1999 and claims the benefit of U.S. Provisional Application No. 60/157,873, filed Oct. 6, 1999. This application also claims the benefit of U.S. application Ser. No. 09/524,501, filed Mar. 13, 2000 now U.S. Pat. No. 7,010,137. The entire teachings of the above applications are incorporated herein by reference.

This application is related to copending U.S. Applications:

| APPLICATION NO. | TITLE |
| --- | --- |
| 09/524,043 | Mass Produced Hearing Aid With a Limited Set of Acoustical Formats |
| 09/524,040 | One-Size-Fits-All Uni-Ear Hearing Instrument |
| 09/524,501 | Hearing Aid |
| 09/188,997 | Hearing Aid With Flexible Shell |
| 60/188,9967 | Hearing Aid Prescription Selector |
| 60/188,721 | Through-Hole and Surface Mount Technologies for Highly-Automatable Hearing Aid Receivers |
| 60/188,857 | Remote Programming and Control Means for a Hearing Aid | all filed on Mar. 13, 2000, the entire teachings of which are incorporated herein by reference.

This application is also related to copending U.S. Applications:

| Ser. Nos. | TITLE |
| --- | --- |
| 09/808,099 | Hearing Aid Prescription Selector |
| 09/805,743 | Remote Programming and Control Means for a Hearing Aid |
| 09/804,982 | Hearing Aid with Tinted Components | all filed on even date herewith, the entire teachings of which are incorporated by reference.

BACKGROUND OF THE INVENTION

Hearing aids are delicate electro-acoustical devices that are intended to perform flawlessly in the harsh environment of the human ear. Hearing aid manufacturers use hard durable earmold materials to protect the delicate electronics and transducers from adverse conditions in and out of the ear. Such durable materials are intended to survive a greater than four year usage life. The earmold can be used not only to protect the internal components of the hearing aid, but also to form an interface between the electronics and the ear canal. This interface must be created to prevent acoustical feedback, to retain the electronics in the ear and prevent irritation or fatigue of the ear canal. A design conflict for the earmold can then exist between the need to have a soft, pliant, nonirritating and comfortable material, and the need to have a durable material to protect the internal electronic components which can last more than four years.

A disposable hearing aid is one designed to have a useful life of much less than the traditional four years. The useful life of a disposable hearing aid can also be governed by the life of the battery. If the battery can be replaced, the hearing aid is no longer disposable and the advantages of the disposable aid are lost. However, a number of other variants on the disposable aid are possible. These variants look to maintain the advantages of disposability while making the system more convenient, comfortable, longer lasting or providing better performance.

"One-size-fits-all" type hearing aids generally lack a flexibility of their tips. Such a lack of flexibility prevents deep penetration into the bony region of an ear canal by the hearing aid. Such hearing aids are also unable to create an acoustic seal in the ear canal. Without such penetration or such a seal in the bony region, the hearing aid can create an occlusion effect in the wearer. Also, hearing aids lacking a proper acoustic seal are prone to feedback.

Feedback is a nagging, unsolved problem for hearing aid manufacturers and dispensers. Feedback in a hearing is present in several forms: electrical, acoustical and mechanical. While electrical feedback is more easily controllable with additional circuitry, the latter two forms of feedback in hearing aids remain significant problems that often reduce the effectiveness of hearing aid fittings. Acoustical or mechanical feedback signals from the hearing aid receiver may be transduced by the hearing aid microphone, amplified in the circuitry and output from the receiver again but with higher gain, creating a feedback loop, and potentially oscillation. A criteria by Nyquist states that a system will oscillate if the gain of the open loop transfer function at a particular frequency is greater than unity and its phase shift of the open loop transfer function is a multiple of 360 degrees. Acoustical feedback occurs through the air inside of the hearing aid housing as well as on the outside of the hearing aid while it is being worn. Mechanical feedback occurs because of the receiver vibrating the hearing aid housing. Hearing aid designers have used many techniques to prevent the creation of such feedback loops. Included are rubber isolation mounts for the microphone and receiver, stiff tubes on the receiver output port and electronically filtering the hearing aid output to suppress energy at the most likely to be troublesome feedback frequencies. Unfortunately, hearing aids frequently have feedback oscillation frequencies in the very range at which the wearer requires amplification most, such as in the frequency range between 1500 and 5000 Hz.

Most in-the-ear (ITE) family of hearing aids, including in-the-canal (ITC) and completely-in-the-canal (CIC) hearing aids, are formed of a custom made shell conforming to the shape of the wearer's ear canal and a faceplate that is cemented to the shell. Components are attached to the faceplate using manual assembly techniques. At the final assembly, the populated faceplate is attached to the shell. Assemblers typically use a solvent to secure the faceplate to the shell. While the solvent joins and secures the two halves together, the assembler must hold the halves together to ensure a tight joint between the two portions which results in a strong seal. This process does not lend itself to high volume production.

When a hearing aid is removed from an ear canal, a differential pressure can be created between the ear canal and the external ambient pressure. To equalize this pressure differential, a port is typically located in the hearing aid. The use of the port, however, can increase the acoustical feedback between the receiver and the microphone. The feedback can lead to oscillations within the hearing aid at relatively low gain levels, compared to hearing aids without a pressure equalization port.

SUMMARY OF THE INVENTION

One possible solution to the conflict between comfort and durability of the earmold is the creation of a disposable hearing aid which uses ultra soft earmold materials that may not last over a four year period, but can be mass produced in an economically competitive manner. The earmold can therefore be replaced more frequently than the disposable hearing aid. An earmold that is replaced on a more frequent basis than the replacement cycle of the disposable aid can provide a user with benefits. If the earmold is replaced on a daily basis, as compared to a base unit which is replaced after a much longer period of time than the earmold, the user can be provided with a high degree of comfort, cleanliness, and performance.

Earmold tip flexibility is necessary to allow for deep ear canal insertion of a hearing aid to overcome the convolutions present in a typical ear canal. An earmold having a flexible tip incorporated with the earmold can have several advantages. These advantages include potentially deep ear canal fittings, efficient coupling of the sound emitted from the receiver to the ear drum, and a corresponding reduction in the required output levels of the receiver. The flexible tip can also provide a comfortable fit even for cases where the tip is located in the bony region of the ear canal. It is observed that when the tip creates a seal in this bony region, the occlusion effect is substantially mitigated.

The compliance of an earmold tip of a hearing aid is also important in hearing aid design. If the earmold tip is compliant enough, the tip can fit into many different sizes and shapes of ear canals. A desirable tip is one that slides easily into the bony structure of the ear canal, feels comfortable and provides a good acoustic seal.

The present invention relates to a modular hearing aid having a replaceable base unit adapted to contain any of a microphone, a receiver, a battery, electronics and controls and a replaceable earmold removably attached to the base unit, the earmold having a compliant material and a retention mechanism for connection to the base unit. Alternately, the modular hearing aid can include a base unit adapted to contain any of a microphone, a receiver, electronics and controls and a replaceable earmold removably attached to the base unit, the earmold having a battery integrated with the earmold. The earmold can have a shell integrated with the earmold, the shell housing the battery.

A modular hearing aid can also have a base unit having any of a microphone, electronics and controls and an earmold where the earmold can include both a receiver and a battery integrated with the earmold. The earmold can also have a shell integrated with the earmold, where the shell houses the receiver and the battery. A modular hearing aid can also have a base unit having any of a microphone, battery, electronics and controls and an earmold having a shell and a receiver where the earmold houses the receiver. Alternately, in this embodiment, the shell of the earmold houses the receiver.

The earmold can form an earmold tip for attachment to a distal end of the base unit, an earmold sleeve for attachment to at least a portion of the base unit or an earmold tip and an earmold sleeve for attachment to the base unit.

The present invention also relates to a modular hearing aid having a replaceable base unit adapted to contain any of a microphone, a receiver and a battery, an earmold removably attached to the base unit, the earmold having a compliant material and a retention mechanism for connection to the base unit and a module comprising a shell and electronics, the module removably connected to the earmold and the base. The earmold can include a battery removably attached to the earmold. The module can have a receiver. The earmold can also have a battery integrated with the earmold and the module can have a receiver or a microphone.

The earmold can form an earmold tip for attachment to a distal end of the base unit. The earmold can also form an earmold sleeve for attachment to at least a portion of the base unit. The earmold can also form an earmold tip and an earmold sleeve for attachment to the base unit.

The invention can also include a modular hearing air having a base unit adapted to contain a microphone, a receiver, electronics and controls and an earmold tip integrated with a battery and removably attached to the base unit, the earmold tip having a compliant material and a retention mechanism for connection to the base unit such that the earmold tip can be connected to the base unit or removed from the base unit and replaced after use.

The invention can also relate to a method for replacing an earmold of a modular hearing aid having the steps of providing a modular hearing aid having a base unit and an earmold, releasing a securing mechanism between the earmold and the base unit, removing the earmold from the base unit, discarding the earmold, placing a second earmold onto the base unit and attaching the securing mechanism. The invention can also relate to a method for replacing a base unit of a modular hearing aid having the steps of providing a modular hearing aid having a base unit and an earmold, releasing a securing mechanism between the earmold and the base unit, removing the base unit from the earmold, discarding the base unit, placing a second base unit onto the earmold and attaching the securing mechanism. The invention can also relate to a method for replacing a component of a modular hearing aid having the steps of providing a modular hearing aid having a base unit component, an earmold component and a module component, releasing at least one securing mechanism among the earmold component, base unit component and module component, removing a component from the modular hearing aid, discarding the component, replacing the component and attaching the at least one securing mechanism among the earmold component, base unit component and module component.

A flexible earmold tip for a hearing aid can have a vibration isolator portion. A mushroom shaped tip portion for insertion into an ear canal and a sound bore can be formed between the vibration isolator portion and the mushroom shaped tip portion. The vibration isolator portion includes a receiver having a diaphragm adapted to vibrate in operation creating acoustical vibrations which cause the receiver to mechanically vibrate. The vibration isolation portion attenuates such mechanical vibrations from the receiver. The vibration isolation portion mechanically decouples the receiver from a hearing aid base unit to isolate the mechanical vibrations of the receiver from the base unit.

The sound bore includes a spring and a compliant material surrounding the sound bore where the spring prevents collapsing of the sound bore and controls the flexibility of the flexible earmold tip. The flexible earmold tip includes an outlet port which allows collection of earwax without clogging the sound bore. The hearing aid, to which the flexible earmold tip is attached, includes a base unit in which is mounted a microphone. The mushroom shaped tip portion creates a seal with an ear canal to acoustically isolate a hearing aid base unit from acoustical vibrations created by the receiver. The vibration isolation portion can include a nest in which the receiver sits to acoustically seal the receiver within the vibration isolation portion thereby acoustically isolating the hearing aid base unit from the acoustical vibrations created by the receiver.

A hearing aid and tip assembly can include a hearing aid base unit having a microphone, a battery and electronics, and a flexible earmold tip having a vibration isolator portion, a mushroom shaped tip portion and a sound bore. The vibration isolator portion is enclosed by the base unit and includes a receiver electrically attached to the base unit where the receiver includes a diaphragm adapted to vibrate in operation causing the receiver to mechanically vibrate. The vibration isolation portion attenuates vibrations from the receiver. The mushroom shaped tip portion is attached to the vibration isolator portion. The sound bore is formed between the vibration isolator portion and the mushroom shaped tip portion and provides a channel for the transfer of sound from the receiver to an ear canal of a user.

The sound bore includes a spring and a compliant material surrounding the sound bore where the spring prevents collapsing of the sound bore and controls the flexibility of the flexible earmold tip. The flexible earmold tip can also include an outlet port which allows collection of earwax without clogging the sound bore. The vibration isolation portion can mechanically decouple the receiver from the base unit to isolate the mechanical vibrations of the receiver from the base unit. The mushroom shaped tip portion can create a seal with an ear canal to acoustically isolate the hearing aid base unit from acoustical vibrations created by the receiver. The vibration isolation portion comprises a nest in which the receiver sits to acoustically seal the receiver within the vibration isolation portion thereby acoustically isolating the base unit from acoustical vibrations created by the receiver.

Feedback can be attenuated within a hearing aid by providing a hearing aid base unit, a receiver, and a hearing aid tip having a flexible mushroom shaped tip portion and vibration isolator portion. Surrounding the receiver with the vibration isolator portion attenuates acoustic vibrations and mechanical vibrations created by the receiver during operation. Securing the vibration isolator portion and receiver within the hearing aid base unit further mechanically decouples the receiver from the base unit. Placing the hearing aid within an ear causes the mushroom shaped tip portion to form a seal with the ear canal to attenuate acoustic vibrations produced by the receiver.

A hearing aid can also include a base unit having an inside portion and adapted to contain any of a microphone, a receiver, a battery, electronics and controls and a potting material which pots at least a portion of the inside portion of the base unit. The material increases the mass of the hearing aid and attenuates vibrations created by the receiver during operation. The potting material can also increase the stiffness of the base unit, thereby raising its resonant frequencies above the typical feedback oscillation frequency range to reduce feedback in the hearing aid. The potting material can include an epoxy. The hearing aid can be disposable.

Feedback can be reduced in a hearing aid by providing a hearing aid having an inside portion adapted to contain any of a microphone, a receiver, a battery, electronics and controls and potting at least a portion of the inside portion of the hearing aid with a material, thereby increasing the mass of the hearing aid. The increased mass of the hearing aid attenuates vibrations created by the receiver during operation and reduces feedback in the hearing aid.

A disposable hearing aid can include a hearing aid portion, a flexible core and a compliant tip portion. The hearing aid portion includes a shell containing a battery, a receiver, a microphone and electronics. The flexible core attaches to the hearing aid portion and forms a sound bore to allow sound produced by the hearing aid portion to travel to the ear canal. The compliant tip portion is adapted to be inserted into an ear canal, surrounds the flexible core and forms an acoustic seal in the ear canal. The tip material can include layers of fingers surrounding the flexible core. The layers of fingers can be made from an elastomer material. The tip material can also include a fluid-filled bladder surrounding the flexible core. The fluid-filled bladder can have air within the bladder or can have liquid within the bladder. The fluid-filled bladder can also have a flexible bladder wall to allow for flexibility of the fluid-filled bladder to accommodate size changes within the ear canal.

A hearing aid includes a first half shell and a second shell attached to the first shell. A microphone, battery, electronics, a receiver and a flexible tip are mounted within a housing formed by the first half shell and the second half shell. A mechanical securing mechanism, located on the first half shell and the second half shell, attaches the first half shell to the second half shell.

The hearing aid can be an in-the-canal hearing aid. The securing mechanism can include an interlocking joint. An adhesive seal can be used in conjunction with the securing mechanism, formed between the first half shell and the second half shell. An aperture can be located on the hearing aid to allow a potting material to be introduced into the hearing aid. The potting material helps to minimize acoustic and mechanical feedback created by the components in the hearing aid. The flexible tip of the hearing aid can include a mushroom shaped tip having an isolation nest where the receiver is mounted within the isolation nest.

The hearing aid can also include a microphone retainer to secure the microphone against a faceplate of the hearing aid. The microphone retainer minimizes the space formed between the microphone and the faceplate, thereby reducing resonances in the acoustic frequency response of the hearing aid. The microphone retainer can be a protrusion formed within the first half shell and the second half shell.

A flexible tip for a hearing aid includes a tip portion, a sound port attached to the tip portion and a vent formed in the flexible tip. The vent provides static pressure equilibrium between an ear canal and an ambient pressure.

The vent can include an aperture located within the flexible tip. The aperture can be located parallel to the sound port of the tip or can be located within a rib formed between the tip portion and the sound port. The aperture can also be formed within the tip portion, preferably at an angle of approximately 90 degrees with respect to a rib formed between the tip portion and the sound port. The aperture can be located in the sound port and preferably is formed by a capillary tube. The capillary tube can include a valve such as a ball valve. The aperture can be filled with a sound absorbing material to minimize acoustical feedback.

The vent can be a channel formed on at least a portion of a surface of the tip portion. The vent can also be a surface roughness formed on a surface of the tip portion, such as a plurality of ridges.

The vent can include a valve to regulating air entering and exiting an ear canal. Such regulation equalizes pressure between the ear canal and an external ambient pressure while minimizing acoustical feedback. The valve can be formed as a flap on the sound port. The valve can also be formed as a hinge valve mounted within the sound port.

A flexible tip that allows a rapid disengagement in a seal formed between the tip and an ear canal includes a sound port having a proximal end and a distal end and a tip portion attached to the sound port, the tip portion having a proximal end and a distal end. The tip portion includes a geometry that distorts upon insertion or removal of the flexible tip from an ear canal, where the distortion equalizing pressure between the ear canal and an ambient pressure.

The proximal end of the sound port can attach to the proximal end of the tip portion thereby allowing the distal portion of the tip portion to distort during insertion to or removal from an ear canal. The tip portion can also include a decreased thickness portion wherein the thickness of the decreased thickness portion tapers from the proximal end to the distal end of the tip portion to allow for distortion of the tip portion. The tip portion can also include at least one protrusion located about the circumference of the tip portion that allow for distortion of the tip portion.

A flexible tip that allows a rapid disengagement in a seal formed between the tip and an ear canal includes a sound port having a proximal end and a distal end and a tip portion attached to the sound port, the tip portion having a proximal end and a distal end. The tip portion includes a surface area that provides a minimal contact surface between an ear canal and the tip portion, the minimal contact surface equalizing pressure between the ear canal and an ambient pressure during removal of the flexible tip form the ear canal. Indentations formed in the surface of the tip portion can create the minimal contact surface.

A flexible tip for a hearing aid that provides static pressure equilibrium between an ear canal and an ambient pressure includes a tip portion and a sound port attached to the tip portion where the tip portion and sound port are formed of a porous material. The porous material allows transfer of air between an ear canal and an ambient pressure to provide pressure equalization.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 50 through 54A–54B show flexible tips that allow a rapid disengagement in a seal formed between the tip and an ear canal when removed.

DETAILED DESCRIPTION OF THE INVENTION

Figure 1:
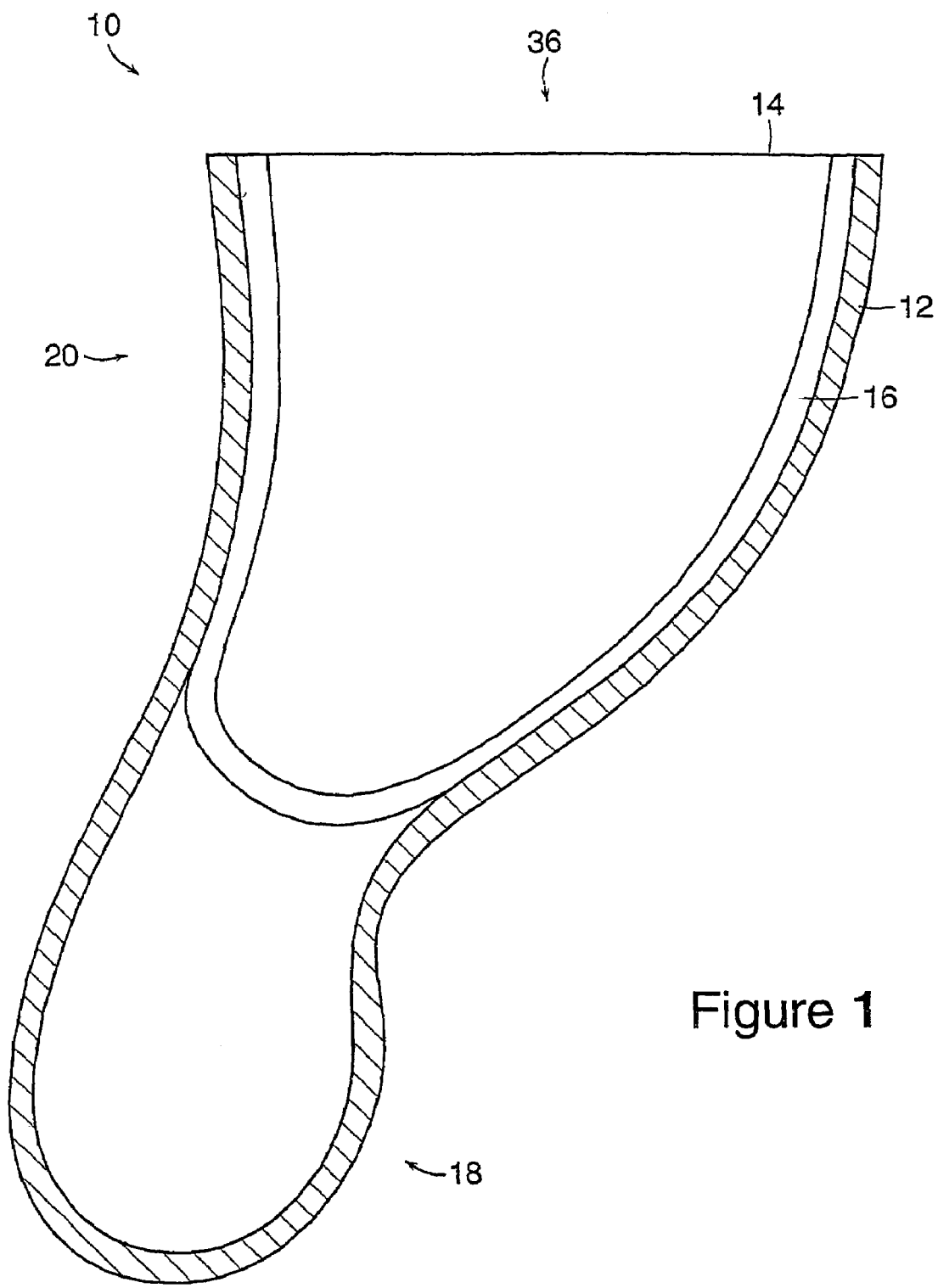
FIG. 1 illustrates an embodiment of a modular hearing aid having a replaceable earmold.

An embodiment of a modular hearing aid 10 is shown in FIG. 1. The modular hearing aid 10 can have an earmold 12 and a base unit 36. The base unit 36 can be a rigid or semi-rigid structure to which the earmold is attached or which holds and aligns other internal components. In one embodiment, the base unit 36 can be a core 14 having a shell 16. In a preferred embodiment both the earmold 12 and the base unit 36 can be replaced by the user after use. The earmold 12 can be replaced on a more frequent basis than the base unit 36.

The earmold 12 can have three preferred embodiments in any given embodiment of the modular hearing aid 10. In one embodiment, the earmold 12 forms an earmold tip 18. The earmold tip 18 can be made from an ultra soft and compliant material. The material can be an injection moldable, biocompatible thermoelastomer, such as C-flex (Consolidated Polymer Technologies, Inc., Largo, Fla.). The material, in a preferred embodiment, can be a castable, biocompatible silicone polymer, such as PlatSil (Polytek Development Corporation, Easton, Pa.). The earmold tip can also attach to a distal end of the shell 16 and extend into an ear canal. In another embodiment, the earmold 12 forms an earmold sleeve 20. The earmold sleeve 20 can be made from an ultra soft and compliant material. The earmold sleeve 20 can also cover a portion or all of the base unit 36. In a third embodiment, as shown in FIG. 1, the earmold 12 forms an earmold tip 18 and sleeve 20. In this embodiment, the tip 18 and sleeve 20 can be made from an ultra soft and compliant material. The tip 18 and sleeve 20 can also cover a portion or all of the shell 16 and can extend into the ear canal.

The earmold 12 can be formed such that it firmly holds onto the core 16 by a retention mechanism. The retention mechanism can be a mechanical snap, mechanical twist-lock or friction, for example.

The modular hearing aid 10 can also include a microphone, a receiver, electronics and controls. The electronics can include an integrated circuit and passive components. The controls can include an on-off control and a volume control. In one embodiment, these components are located within the core 14. The modular hearing aid can also have a battery.

Figure 2:
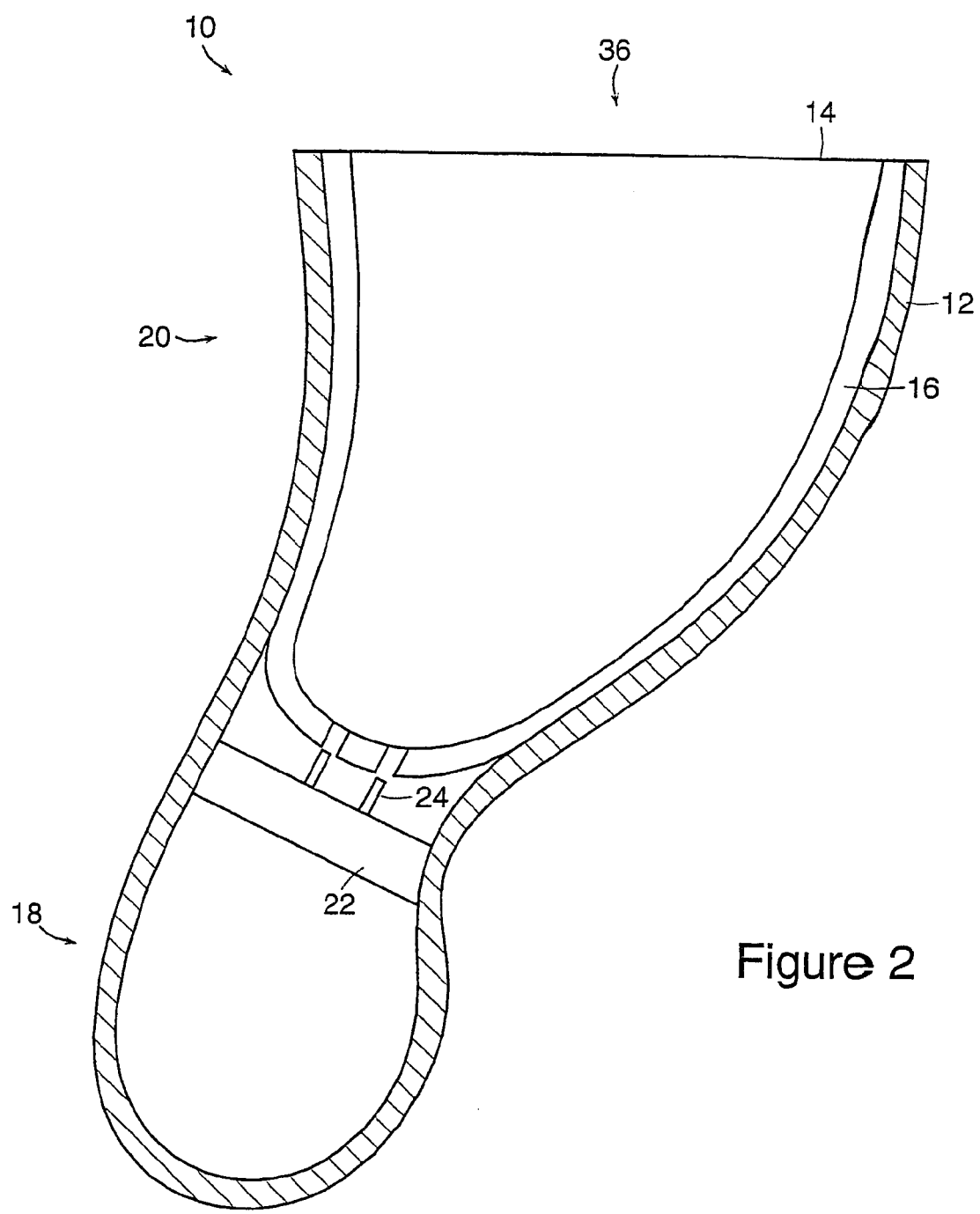
FIG. 2 illustrates an alternate embodiment of the hearing aid of FIG. 1, the hearing aid having a battery integral with an earmold.

In an alternate embodiment of the hearing aid with replaceable earmold 10, the earmold 12 can include a battery 22, as shown in FIG. 2. The battery 22 integrated with the earmold 12 includes an electrical connection to the base unit 36. The battery 22 can include contacts 24 which connect to the core 14. In this embodiment, the earmold 12 and battery 22 are provided as a single unit, which is replaceable on the hearing aid core 14. Frequent replacement of the battery 22 and earmold 12 can provide a user with an optimum level of comfort, cleanliness, performance and economy. Integrating the battery 22 with the earmold 12, the battery 22 can be more easily handled by the user because the integrated battery and earmold are larger than the battery alone.

The combined earmold 12 and battery 22 can form an ear mold tip 18, an ear mold sleeve 20 or an ear mold tip 18 and sleeve 20, similar to that described above. The earmold 12 and battery 22 can be retained on the core 14 by mechanical snap or friction, for example. The contacts 24 of the battery 22 can also be used to retain the combined earmold 12 and battery 22, to the core 14.

Figure 3A:
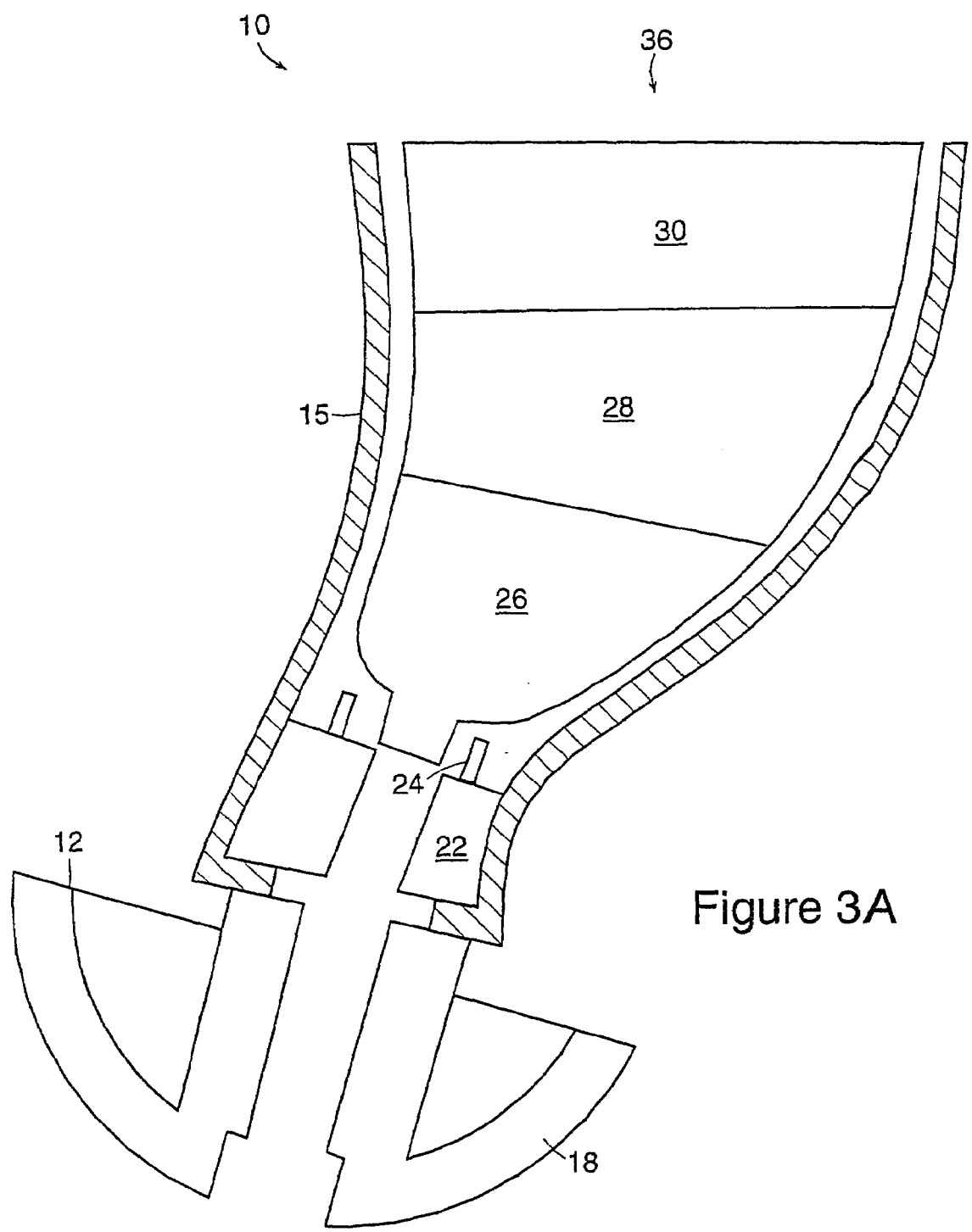
FIG. 3A shows an alternate embodiment of the hearing aid of FIG. 1, the hearing aid having a battery and an earmold integral with a shell.

FIG. 3A illustrates an embodiment of a modular hearing aid 10 having a replaceable earmold 12, shell 15 and battery 22 formed as one integral unit. This unit can act as a covering for a hearing aid base unit. The battery 22 integrated with the earmold 12 includes an electrical connection to the base unit 36. The components of a hearing aid that can be replaced or are preferably replaced are the battery 22, the earmold 12 and the shell 15. The battery 22 can be replaced because batteries generally lose their powering ability after a certain amount of use. The earmold 12 and the shell 15 can be replaced because the components contacts the ear canal and can require frequent cleaning.

This embodiment of the modular hearing aid 10 can have a base unit 36 which can include a microphone 30, electronics 28 and a receiver 26. The earmold 12 and shell 15 integral with the battery 22 can be mechanically or frictionally attached to the non-replaceable base unit 36. The base unit 36 can fit within the shell 15 for attachment. The battery 22 can have contacts 24 which can connect to the base unit 36. When the contacts 24 of the battery 22 are mated to the base unit 36, current can flow from the replaceable battery 22 to the electronics 28 in the base unit 36. The contacts 24 of the battery 22 can also be used to retain the integrated earmold 12 and battery 22 to the base unit 36.

Figure 3B:
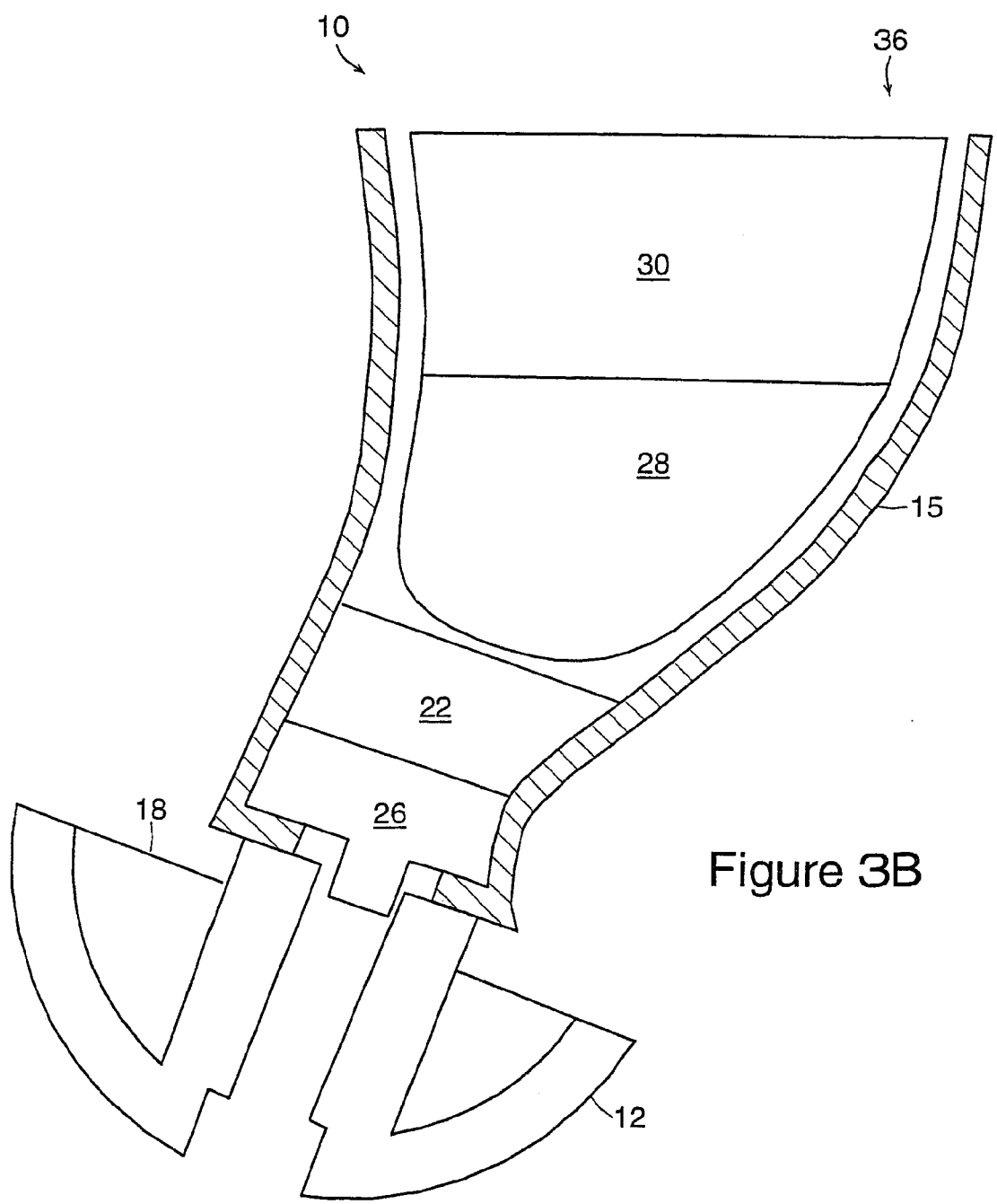
FIG. 3B shows an alternate embodiment of the hearing aid of FIG. 1, the hearing aid having a battery, a receiver and an earmold integral with a shell.

FIG. 3B illustrates another embodiment of the modular hearing aid 10 where the earmold 12 and shell 15 are integrated with a battery unit 22 and a receiver 26. In this embodiment, the hearing aid 10 can also have a base unit 36 having a microphone 30 and electronics 28. The battery 22 integrated with the earmold 12 includes an electrical connection to the base unit 36. In this embodiment, the earmold 12, shell 15, battery 22 and receiver 26 are integrated into a single unit that can act as a covering for a base unit 36 and that the unit can be replaced more frequently than the base unit 36, which may or may not be disposable. This provides convenience, cleanliness and product longevity to the user.

The receiver 26 can be incorporated into the replaceable earmold 12 and shell 15 for two reasons. First, the receiver 26 is preferably placed deep into the ear canal in order to achieve the highest effective sound pressure levels possible. For many types of hearing aids, the earmold 12 also protrudes deeply in the ear canal to guide and position the electronics 28 and receiver 26. Therefore integrating the receiver with the earmold 12 and shell 15 allows placement of the receiver deep into the ear canal.

Second, the receiver 26 can be incorporated into the replaceable earmold 12 and shell 15 because it is very prone to damage if the modular hearing aid 10 is dropped from a height of several feet onto a hard surface. By integrating the receiver 36 with the replaceable earmold 12 and shell 15, replacement of a damaged receiver 36 is easily performed by a user. Being able to replace the receiver after damage can add longevity to the unit 10.

Figure 4A:
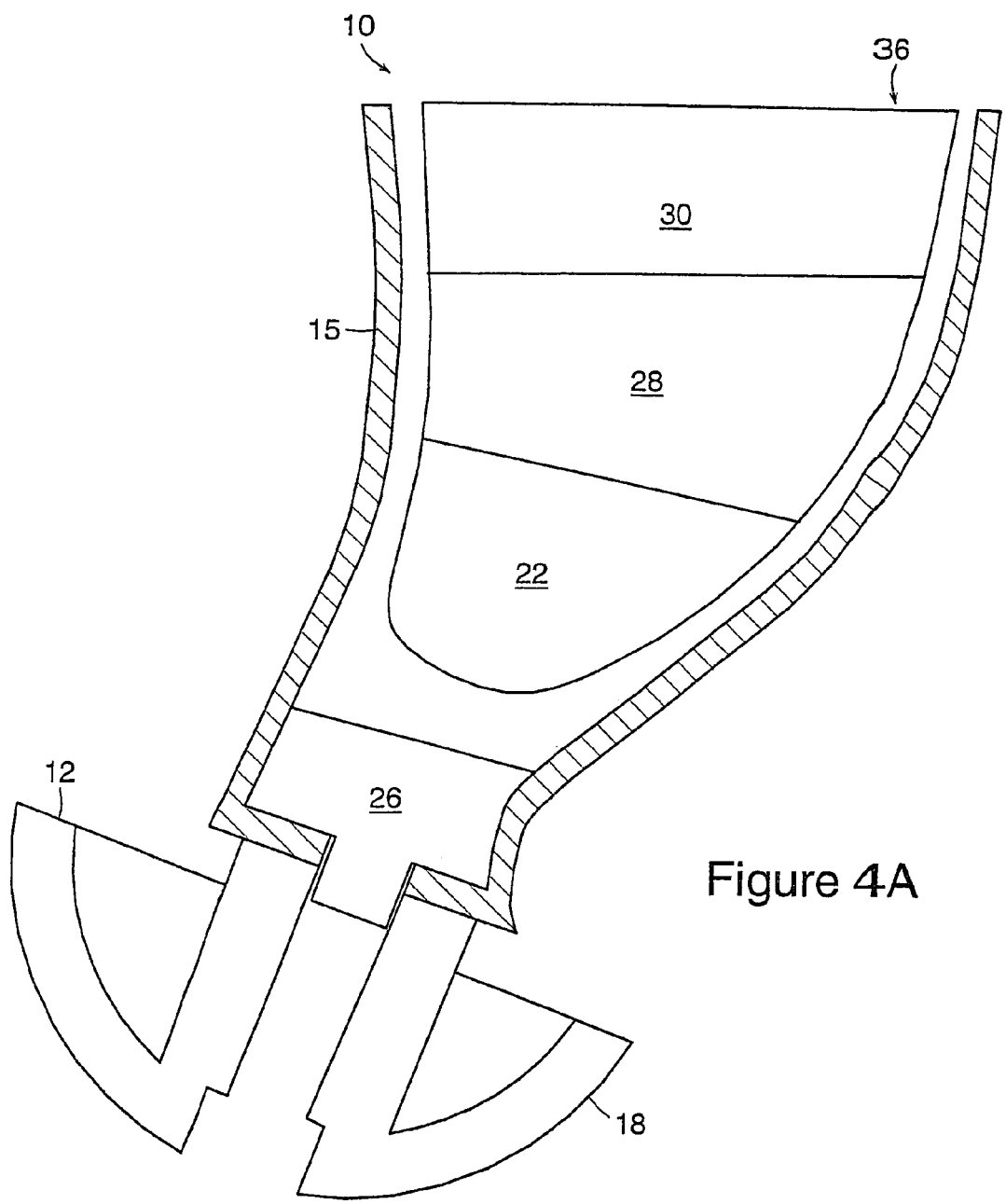
FIG. 4A illustrates a hearing aid having an integral earmold and shell, the shell housing a receiver.

FIG. 4A shows an embodiment of a modular hearing aid 10 having a replaceable earmold 12, shell 15 and receiver 26, formed as one unit, where the shell 15 houses the receiver 26. The unit can act as a covering for a hearing aid base unit. The components of a hearing aid that can be replaced or are preferably replaced are the receiver 26, the earmold 12 and the shell 15. The receiver 26 can be easily replaced by a user when the receiver 36 is damaged. The earmold 12 and the shell 15 can be replaced because the components contacts the ear canal and can require frequent cleaning.

This embodiment of the modular hearing aid 10 can have a base unit 36 which can include a microphone 30, electronics 28 and a battery 22. The earmold 12 and shell 15 integral with the receiver 26 can be mechanically or frictionally attached to the non-replaceable base unit 36. The base unit 36 can fit within the shell 15 for attachment. The receiver 26 can electrically connect to the base unit 36.

Figure 4B:
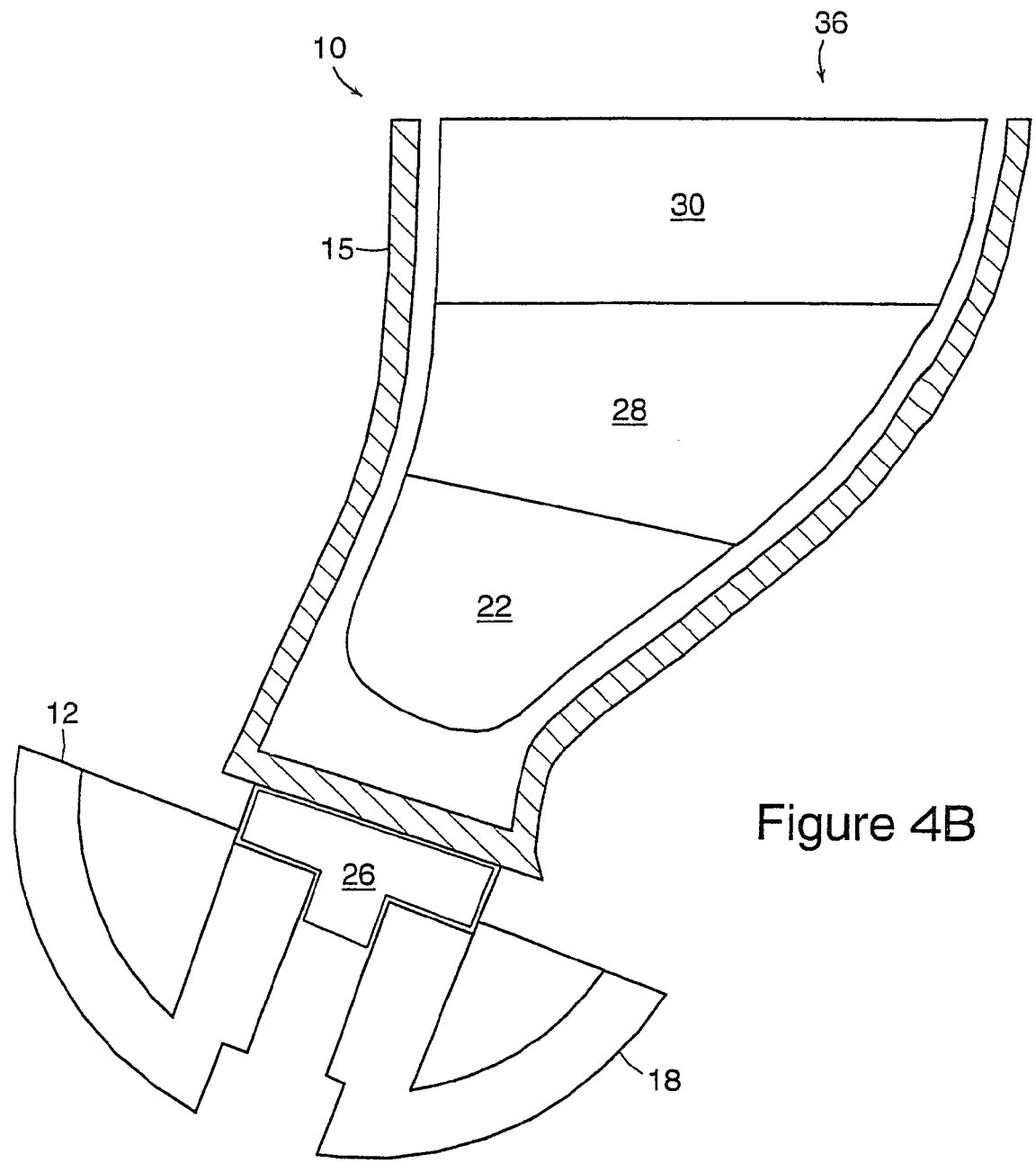
FIG. 4B illustrates a hearing aid having an integral earmold and shell, the earmold housing a receiver.

FIG. 4B shows another embodiment of a modular hearing aid 10 having a replaceable earmold 12, shell 15 and receiver 26, formed as one unit, where the earmold 12 houses the receiver 26. The unit can act as a covering for a hearing aid base unit. Similar to the hearing aid 10 described above, the modular hearing aid 10 can have a base unit 36 which can include a microphone 30, electronics 28 and a battery 22. The earmold 12 having the receiver 26 and the shell 15 can be mechanically or frictionally attached to the non-replaceable base unit 36. The base unit 36 can fit within the shell 15 for attachment and the receiver 26 can electrically connect to the base unit 36.

FIGS. 3A, 3B, 4A and 4B illustrate the earmold 12 as having an earmold tip 18. As shown, the earmold tip 18 has a mushroom shaped design. Such a design can aid in securing the modular hearing aid 10 within a user's ear. The mushroom shaped design can also provide comfort, ease of insertion and sound attenuation. The mushroom shaped tip can be made from a low modulus, low durometer material, such as silicone. Such a material allows the mushroom shaped tip to be flexible and compliant. The earmold tip 18 having a mushroom shaped design can be used with all embodiments of the modular hearing aid 10.

Figure 5:
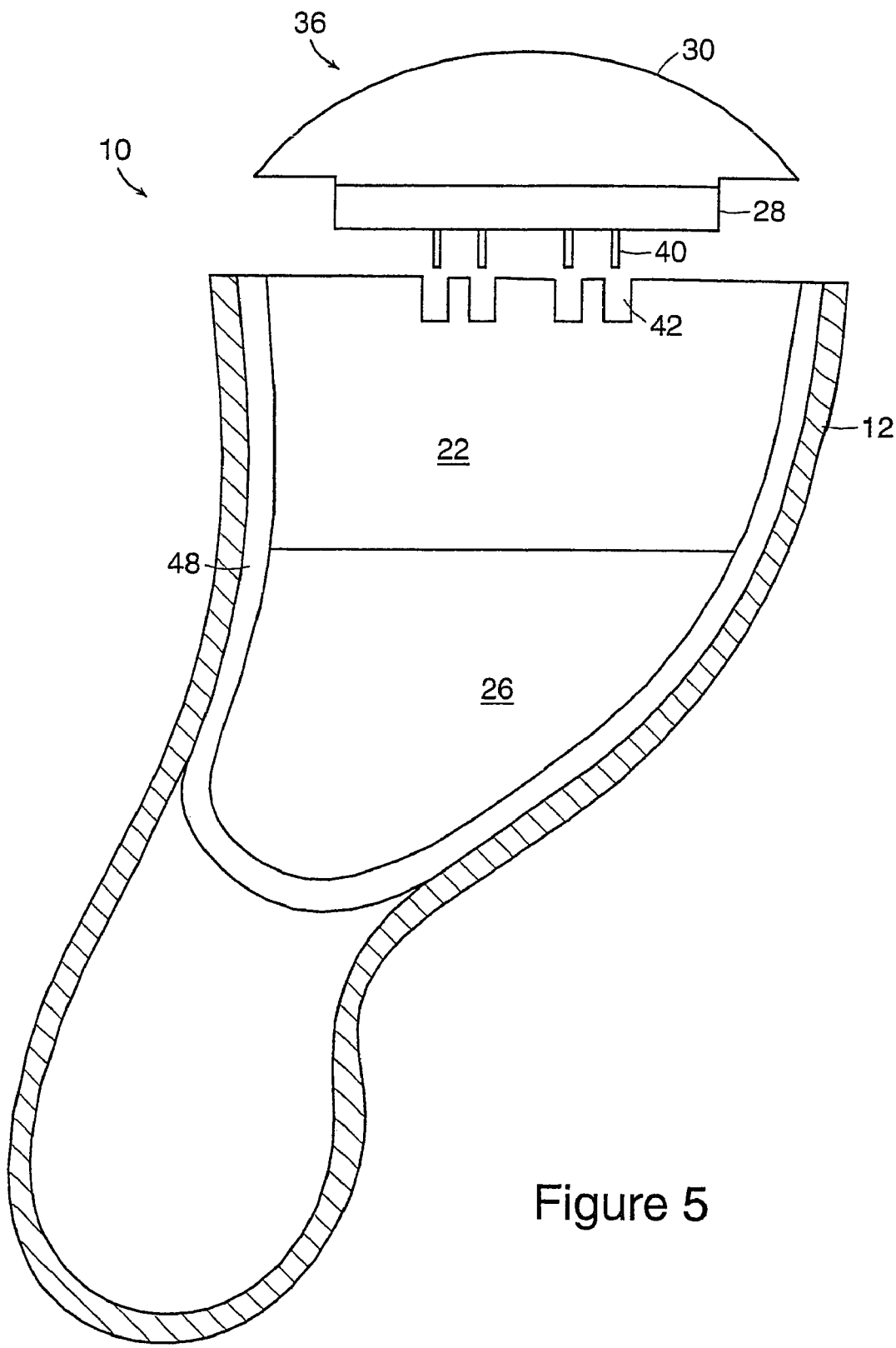
FIG. 5 illustrates an alternate embodiment of the hearing aid of FIG. 1, the hearing aid having a replaceable earmold integrated with a shell having a battery and receiver.

FIG. 5 illustrates an alternate embodiment of the modular hearing aid 10 where the replaceable earmold 12 is integrated with a shell 48 having a battery 22 and receiver 26. Some hearing aid shapes would benefit from a better design if the shell 48 was replaceable. For example, most in-the-canal (ITC) and completely-in-the-canal (CIC) hearing aids have receivers which are acoustically and mechanically sealed to a shell. These hearing aids would realize the benefits of a replaceable receiver section only if the shell 48 was replaced. By integrating the earmold 12 with a shell containing a battery 22 and receiver 26, in this embodiment, the shell 48 is replaceable with the earmold 12.

This embodiment can have a base unit 36 having a microphone 30 and electronics 28. The base unit 36 can have base unit connectors 40 which allow for electrical contact between a receptacle section 42 and the base unit 36. In a preferred embodiment, power (battery) and signal (receiver) conductors are required. The earmold 12 integral with the shell 48, having the battery 22 and receiver 26, can be mechanically or frictionally attached to the non-replaceable base unit 36. The mechanical attachment can be a snap fit.

Figure 6:
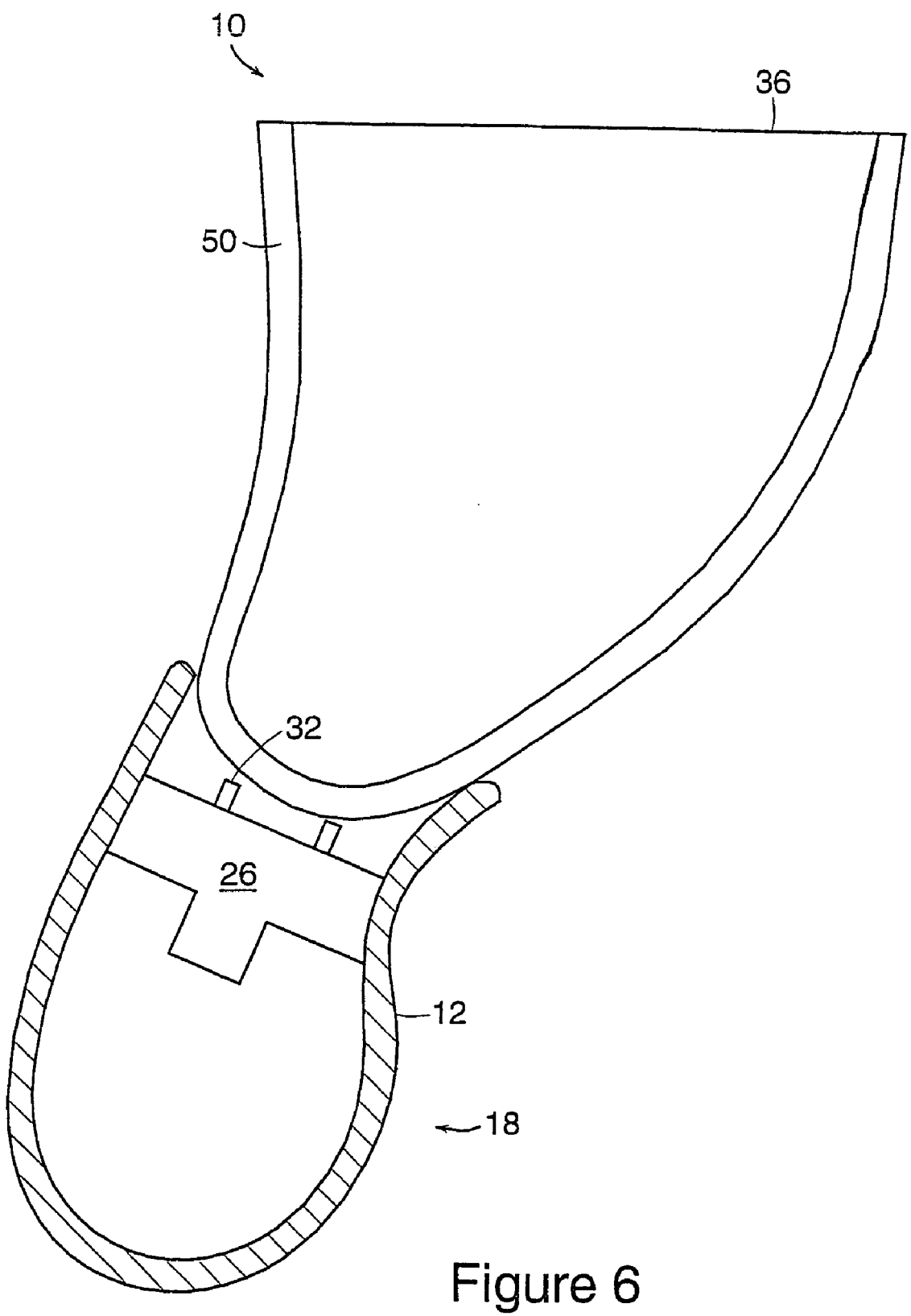
FIG. 6 illustrates an alternate embodiment of the hearing aid of FIG. 1, the hearing aid having a receiver incorporated with the earmold.
Figure 7:
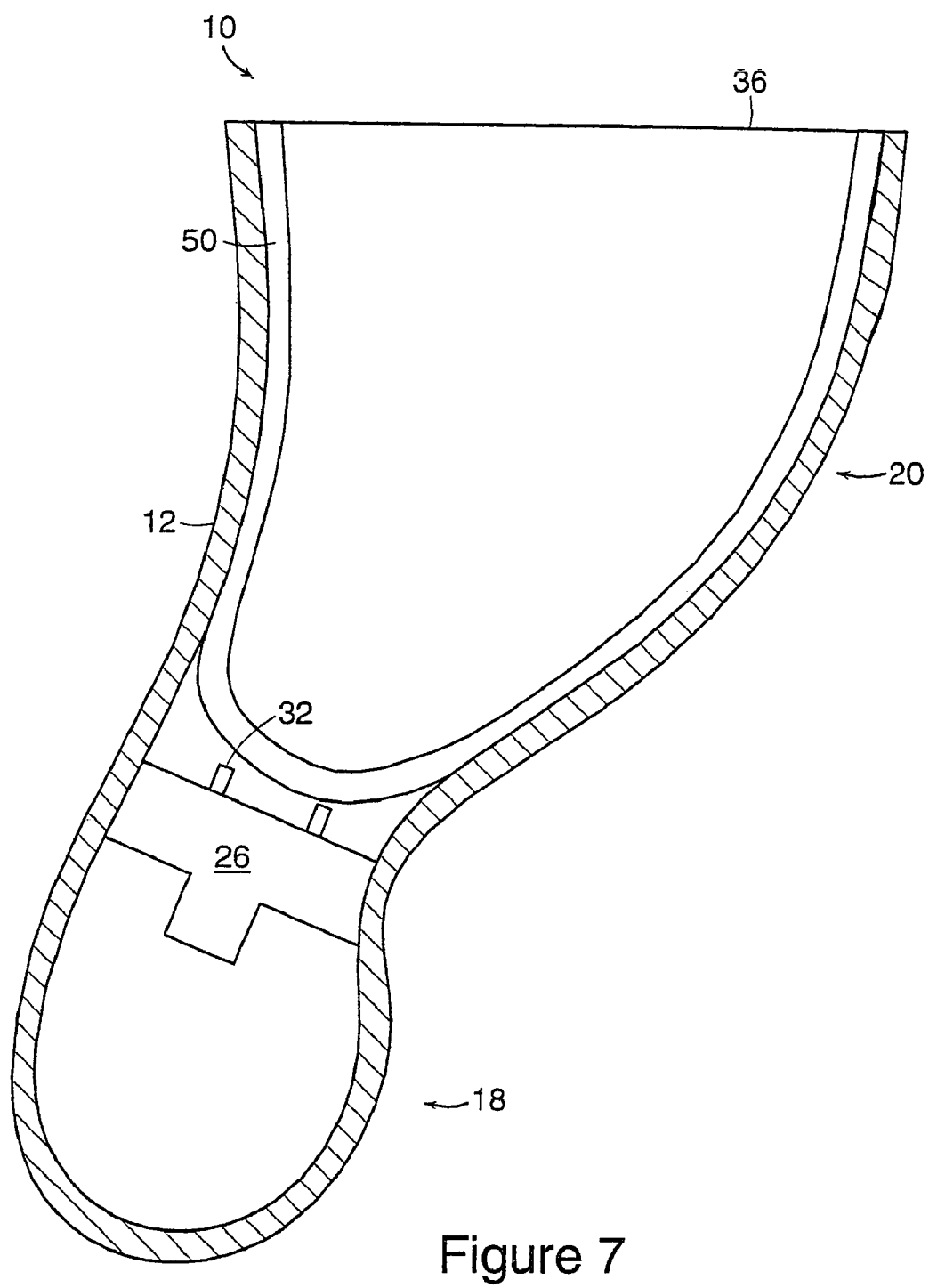
FIG. 7 illustrates an alternate embodiment of the hearing aid of FIG. 6.

FIGS. 6 and 7 show embodiments of the hearing aid 10 where a receiver 26 is incorporated with the earmold 12. In one embodiment, shown in FIG. 6, the earmold 12 and receiver 26 are incorporated as an integral and replaceable unit but the earmold 12 is defined as a tip section 18 only. In another embodiment, shown in FIG. 7, the earmold 12 is defined as a tip 18 and a sleeve 20. In either embodiment, the modular hearing aid 10 can have a base unit 36 which can include a shell 50, a microphone 30, a battery 22 and electronics 28.

The advantages of having a replaceable earmold 12 and receiver 26 have been described above. In this embodiment, the battery 22 within the base unit 36 can be replaced, but is not integrated into the earmold 12. The earmold 12 integral with the receiver 26 can be mechanically or frictionally attached to the base unit 36. The receiver 26 can have contacts 32 which can provide an electrical connection to the base unit 36 and allow the passage of signal from the base unit 36 to the receiver 26. The contacts 32 of the receiver 26 can also be used to retain the integrated earmold 12 to the base unit 36.

Figure 8:
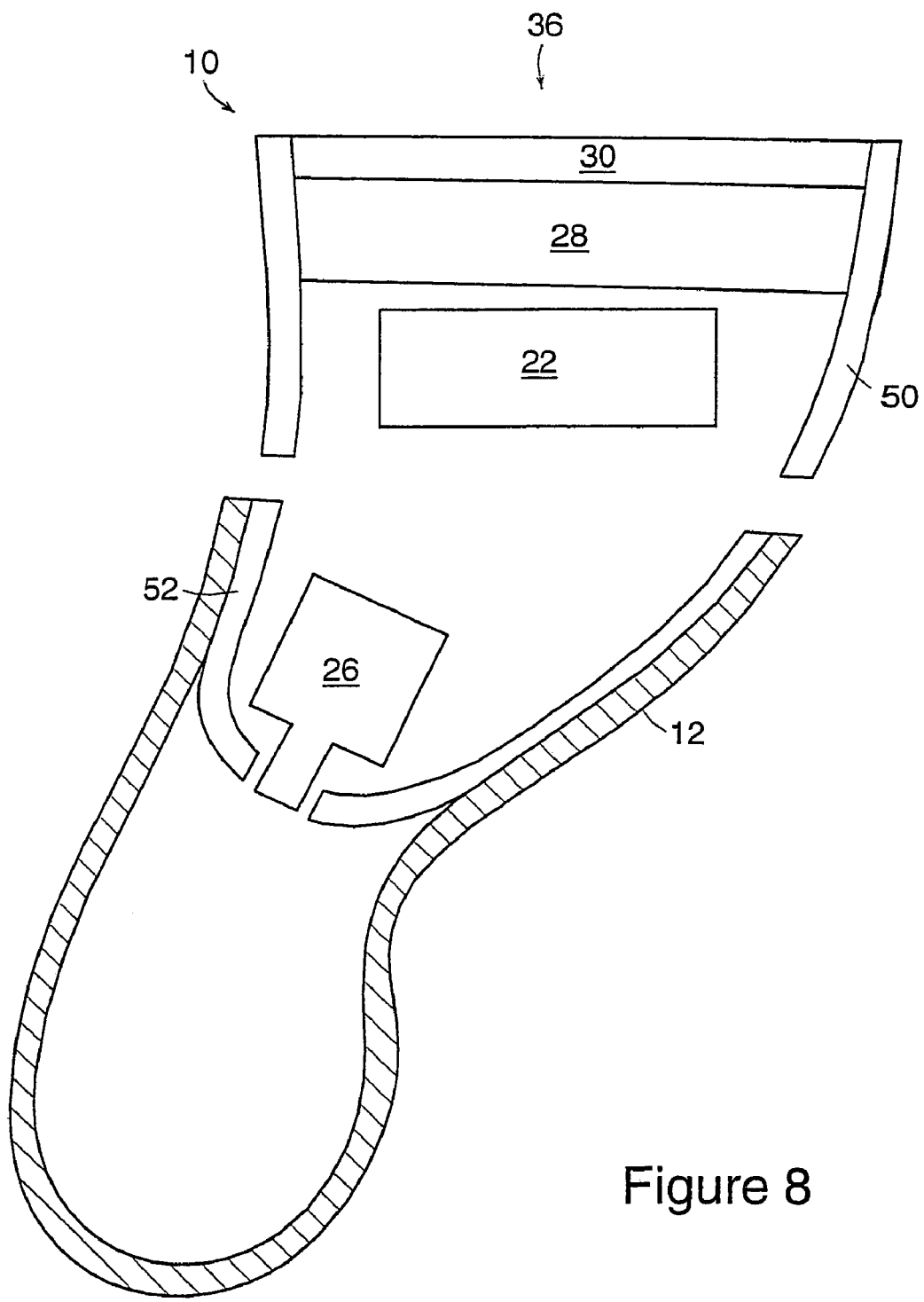
FIG. 8 illustrates an alternate embodiment of the hearing aid of FIG. 1 where the replaceable earmold incorporates a portion of the shell.

In another embodiment, the base unit 36 can have a base unit shell 50 and an earmold shell 52 where the earmold shell 52 can be integrated with the earmold 12, as shown in FIG. 8. In this embodiment, the integrated earmold 12 and shell 52, as well as the battery 22, can be replaced. The battery 22, however, is preferably not integrated with the earmold 12 and shell 52. The integrated earmold 12 and shell 52 can also include a replaceable receiver 26. The hearing aid 10 can also have a base unit 36 which can include a microphone 30, electronics 28 and a shell 50. The base unit shell 50 and the earmold shell 52 include an attachment mechanism which allows each shell to be joined together. The attachment mechanism can include a flexible integral snap having two joinable portions, a first portion molded to the base unit shell 50 and a second portion molded to the earmold shell 52. The attachment mechanism can also include screw threads between the shell 50 and earmold shell 52 to allow for the attachment of the shell 50 to the earmold shell 52. The attachment mechanism can create a seal between the base unit shell 50 and the earmold shell 52. The seal protects the internal performance of the hearing aid and minimizes internal acoustical feedback.

One advantage of this embodiment is that the user can independently replace either the integrated earmold 12 and shell 52 combination or the battery 22, as required. The battery 22 can be replaced at the end of its useful life. The integrated earmold 12 and shell 52 can be replaced for sanitary, cleanliness or performance reasons.

No electrical connections are needed between the earmold 12 and shell 52 combination. The integrated earmold 12 and shell 52 combination can be mechanically or frictionally attached to the non-replaceable base unit 36, as earlier defined.

The battery 22 and receiver 26 can have electrical connections within the modular hearing aid 10. The battery 22 can be electrically connected to the electronics 28 and can provide power to the hearing aid 10. In a preferred embodiment, the battery 22 is held within the hearing aid 10 by a clip. The receiver 26 can also be electrically connected to the electronics 28. In a preferred embodiment, the receiver 26 is electrically connected to the electronics 28 by spring conductors.

Figure 9:
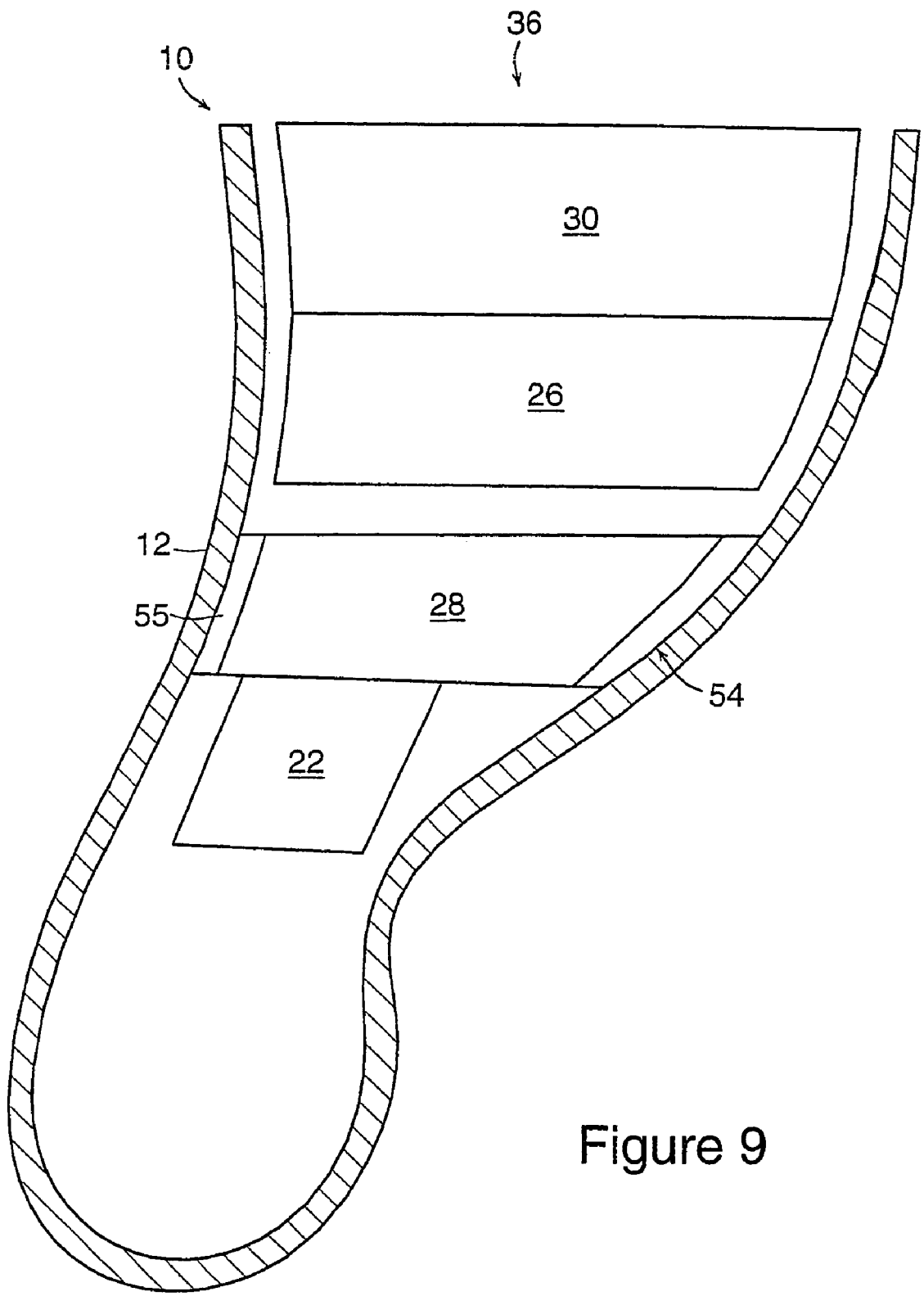
FIG. 9 shows an alternate embodiment of the hearing aid of FIG. 1 where the earmold allows the replacement of an integral shell and electronics module.

FIG. 9 illustrates an alternate embodiment of a replaceable earmold 12 which allows the replacement of an integrated shell and electronics module 54 as a separate component of the earmold 12. The modular hearing aid 10, in a preferred embodiment, can include the earmold 12 having the shell and electronics module 54 and can also include a replaceable battery 22 connected to the shell and electronics module 54 and a non-replaceable base unit 36 having a microphone 30 and a receiver 26.

The battery 22 can be replaced at the end of its useful life. The shell and electronics module 54 and the earmold 12 are not integrated. The earmold 12 can be replaced separately from the shell and electronics module 54 for the purpose of cleanliness, sterility, and performance. In one embodiment, the earmold 12 can be replaced on a daily basis. For peak performance and maximum unit longevity, this embodiment also encompasses the replacement of the integral shell and electronics module 54. As electronic components continue to improve faster than improvements to transducer technology, it can be advantageous to replace the electronics 28 and, in particular, the hearing aid's 10 integrated circuit, independent of the transducers. This disclosure defines an integrated shell and electronics module 54 where the shell 55, in a preferred embodiment, is a convenient and protective means for mounting the electronics 28. The shell 55 can provide both electrical and mechanical connection and attachment means for the electronics 28. The shell 55 can provide the electronics 28 with a frictional attachment with the earmold 12 and with an electrical connection to the receiver 26 of the base unit 36 and the battery 22.

Figure 10:
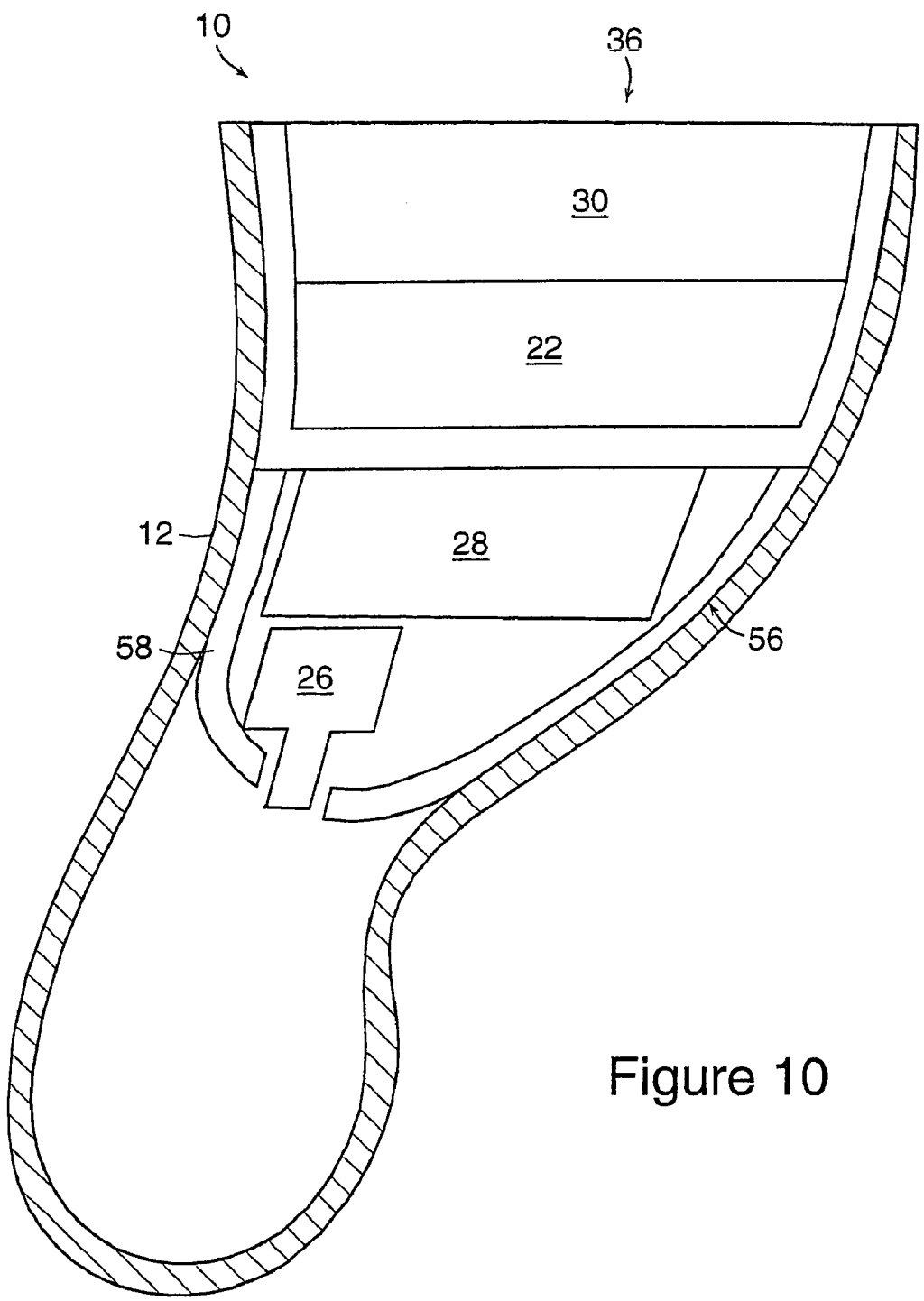
FIG. 10 shows an alternate embodiment of the hearing aid of FIG. 1 where the earmold allows the replacement of an integral shell, electronics and receiver module.

FIG. 10 shows another embodiment of the modular hearing aid 10 having a base unit 36, a replaceable earmold 12 and a replaceable shell 58 which integrates electronics 28 and a receiver 26 into a single module 56. The base unit 36 can include a microphone 30 and a battery 22. In this embodiment, the earmold 12 is separately replaceable from the shell, electronics and receiver module 56.

The battery 22 and receiver 26 can have electrical connections within the modular hearing aid 10. The battery 22 in the base unit 36 can be electrically connected to the electronics 28 in the module 56. The receiver 26 can also be electrically connected to the electronics 28. In a preferred embodiment, the receiver 26 is electrically connected to the electronics 28 by spring conductors.

This embodiment combines the advantages of a modular hearing aid 10 having a non-replaceable base unit 36 with the advantages of a replaceable receiver 26. The integration of the electronics 28 and the receiver 26 in a separate replaceable shell module 46 allows the user to replace the electronics 28 and receiver 26 in the hearing aid 10, simultaneously, as needed.

Figure 11:
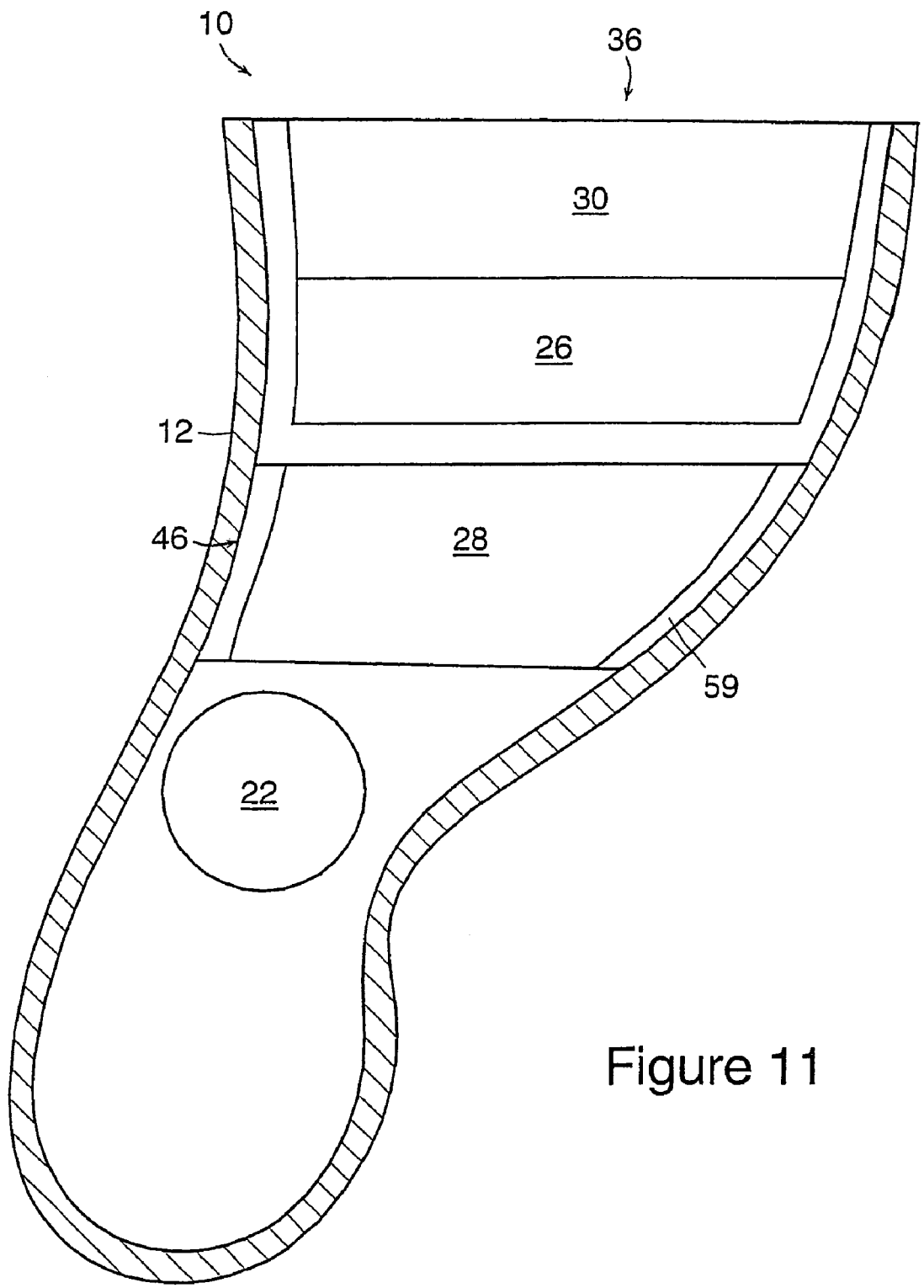
FIG. 11 illustrates an alternate embodiment of the hearing aid of FIG. 1 where the hearing aid has a base unit, a replaceable shell module and a replaceable earmold integrated with a battery.
Figure 12:
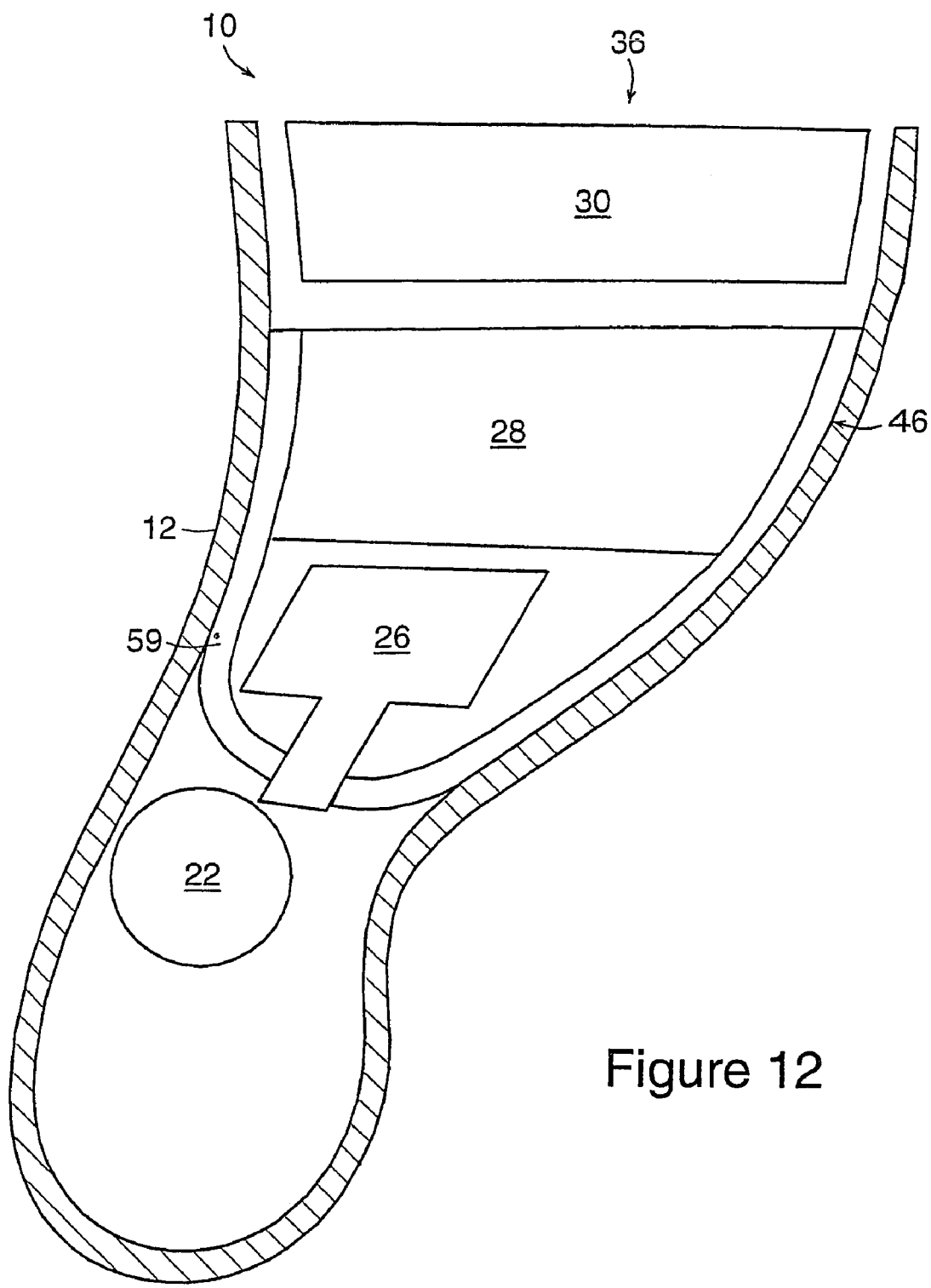
FIG. 12 illustrates an alternate embodiment of the hearing aid of FIG. 11.
Figure 13:
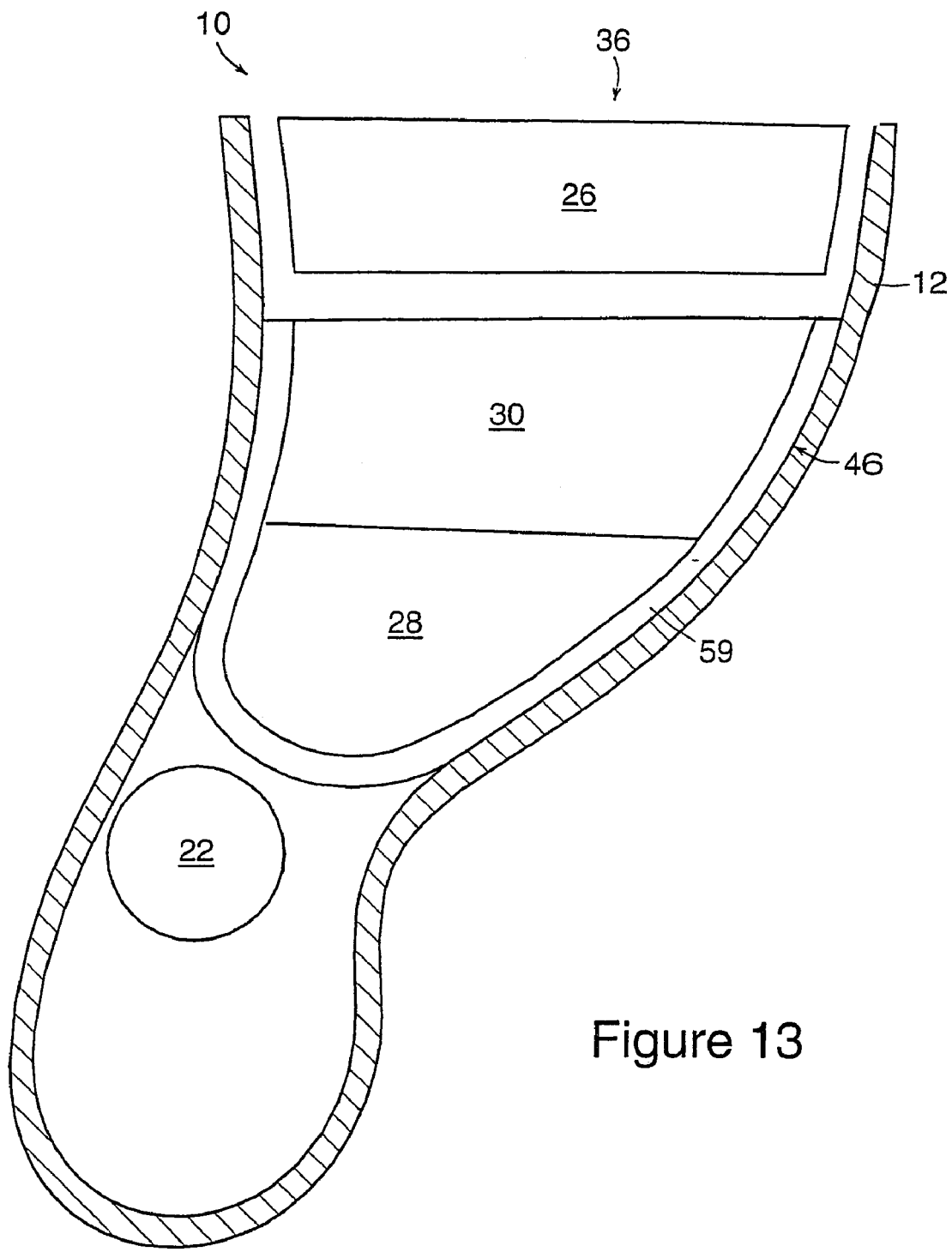
FIG. 13 shows an alternate embodiment of the hearing aid of FIG. 11.

FIGS. 11, 12 and 13 show embodiments for a modular hearing aid 10 where the hearing aid 10 has a base unit 36, a replaceable shell module 46 having electronics 28 and a replaceable earmold 12 integrated with a battery 22. In each embodiment, the earmold 12 can be separately replaced for the purpose of cleanliness, sterility, and performance. The battery 22 in a hearing aid can be replaced at the end of its useful life. The battery 22 integrated with the earmold 12 can include an electrical connection to the base unit 36. By integrating the replaceable earmold 12 with the battery 22, a user can simultaneously provide himself with a sterile covering and a fresh power source for a modular hearing aid 10. The electronics 28 of the module 46 can be electrically connected to the base unit 36. The electronics 28 of the module 46 can also be electrically connected to the battery 22 integrated with the earmold 12. Also in each embodiment, the shell module 46 can be replaced separately from the integrated earmold 12 and battery 22 combination.

In the embodiment of FIG. 11, the base unit 36 can have a microphone 30 and a receiver 26 and the replaceable shell module 46 can have a shell 59 and electronics 28. The integration of the electronics 28 in a separate replaceable shell module 46 allows the user to replace only the electronics 28, as is needed. For example, as electronic components continue to improve faster than improvements to transducer technology, it can be advantageous to replace the electronics 28 of a hearing aid independent of the transducers.

In the embodiment shown in FIG. 12, the base unit 36 can have a microphone 30 and the replaceable shell module 46 can have a shell 59, electronics 28 and a receiver 26. The integration of the electronics 28 and the receiver 26 in a separate replaceable shell module 46 allows the user to replace the electronics 28 and receiver 26 in the hearing aid 10, simultaneously, as needed.

In the embodiment of FIG. 13, the base unit can have a receiver 26 and the replaceable shell module 46 can have a shell 59, a microphone 30 and electronics 28. The integration of the electronics 28 and the microphone 30 in a separate, replaceable shell module 46 allows the user to replace the electronics 28 and microphone 30 in the hearing aid 10 simultaneously, as is needed.

The invention can also include a method for replacing an earmold of a modular hearing aid. In this method, a modular hearing aid having a base unit and an earmold can first be provided. Next a securing mechanism between the earmold and the base unit can be released. This allows the separation of the earmold and the base unit. The earmold can then be removed from the base unit, discarded and replaced with a second earmold onto the base unit. This allows a user to place a clean or fresh earmold onto an existing base unit. The earmold can then be attached to the base unit with the securing mechanism.

In an alternate method, the base unit of a modular hearing aid can be replaced. In this method, a modular hearing aid having a base unit and an earmold can first be provided. Next a securing mechanism between the earmold and the base unit can be released. This allows the separation of the earmold and the base unit. The base unit can then be removed from the earmold, discarded and replaced with a second base unit. This allows a user to replace a non-functioning or malfunctioning base unit with a working base unit. The base unit can then be attached to the ear mold with the securing mechanism.

In another method, a component of a modular hearing aid can be replaced. In this method a modular hearing aid having a base unit component, an earmold component and a module component can be provided. Next, at least one securing mechanism can be released among the earmold component, base unit component and module component. Next a component can be removed from the modular hearing aid, discarded and replaced. The at least one securing mechanism can then be attached among the earmold component, base unit component and module component.

Figure 14:
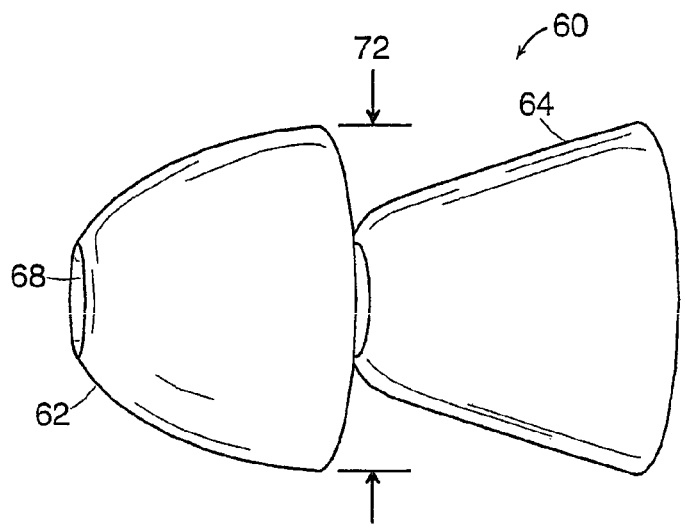
FIG. 14 illustrates a top view of a flexible earmold tip for a hearing aid.
Figure 15:
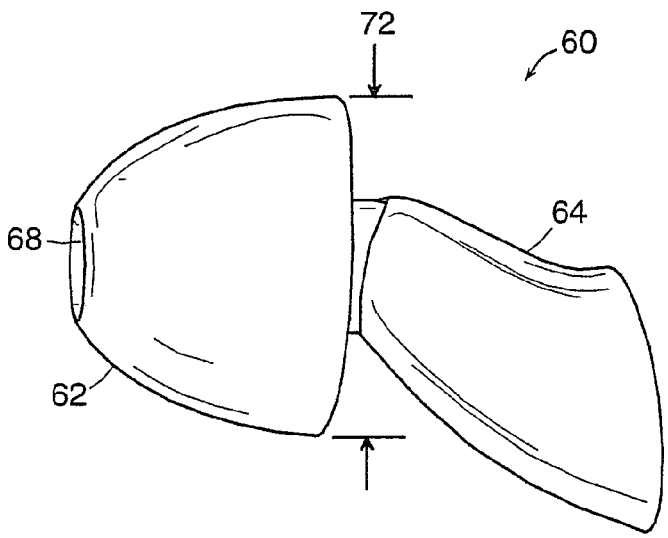
FIG. 15 illustrates a side view of a flexible earmold tip for a hearing aid.
Figure 16:
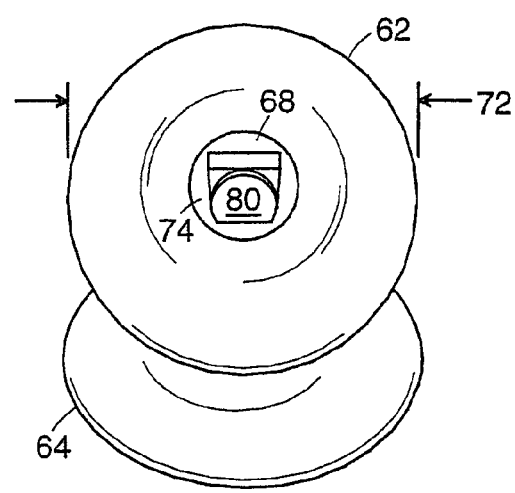
FIG. 16 illustrates a front view of a flexible earmold tip for a hearing aid.

FIGS. 14, 15 and 16 show an earmold tip 60 which has an integral mushroom shaped tip portion 62 and integral vibration isolator portion 64. The earmold tip 60 can provide comfort, ease of insertion, sound attenuation, and can help to anchor the unit in an ear.

The flexible earmold tip 60 can be constructed from a soft, low durometer material, such as silicone, and can be produced by a cast molding process for inexpensive manufacture. The soft material can provide comfort to the wearer, while generating an acceptable acoustic seal between the hearing aid and ear. Because the earmold tip 60 is constructed of a low modulus, low durometer material, the earmold tip 60 provides a high level of comfort for users even when the tip 60 is located in the bony region of the ear.

FIG. 16 shows an outlet port 68 which has been recessed to essentially provide a mechanism for collecting wax without clogging a sound bore 74. An integral membrane can also be deployed in the outlet port 68 to serve as a wax guard. Such a wax collection mechanism can also aid in providing comfort to a user. Also shown is a sound bore 74. The sound bore 74 connects the mushroom shaped tip portion 62 to the vibration isolator portion 64 and carries sound created by a receiver to an ear canal. The sound bore 74 has a rectangular cross-sectional shape. During manufacture of the tip 60, a spring 70 is placed around the sound bore 74 prior to the casting of the compliant material over the spring 70. The rectangular cross-sectional area of the sound bore 74 can help to maintain the position of the spring 70 during casting of the tip 60. Therefore, the sound bore 74 is surrounded not only by the spring 70 but by the compliant material which forms the tip 60. The sound bore 74 can have a cross-sectional area such that the bore 74 increases high frequency acoustical transmission from a receiver 26 to a user's ear canal. In this respect, the sound bore 74 can help match the impedance of the ear canal to the receiver 26. The sound bore 74 can also include a proximal sound bore portion 80 having a circular cross-sectional area. The circular cross-sectional area of the proximal portion 80 provides a transition between the rectangular cross-sectional area of the sound bore 74 and a receiver 26.

Figure 17:
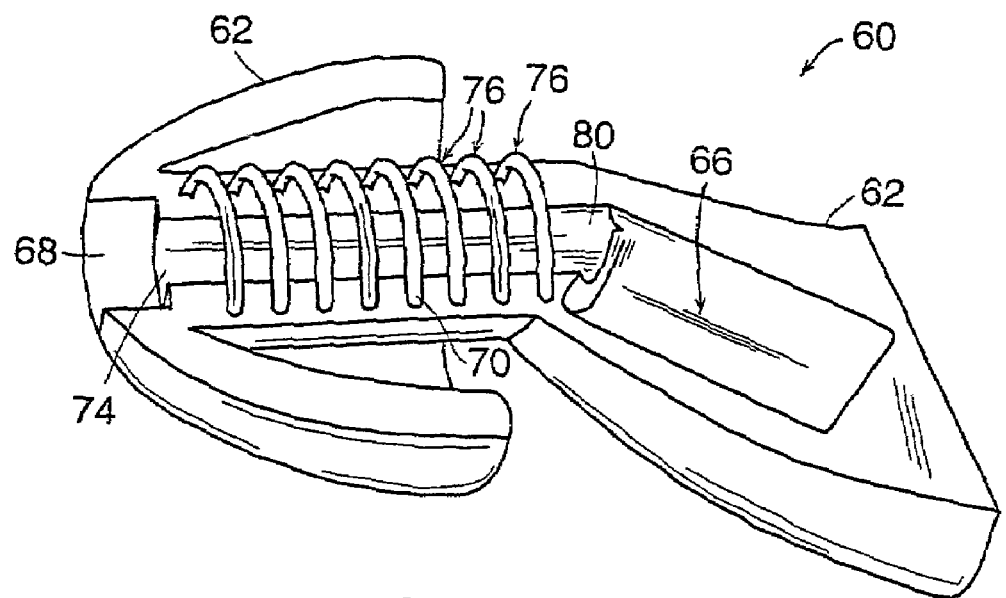
FIGS. 17 and 18 shows a cross-sectional view of a flexible earmold tip.

The mushroom shaped tip portion 62 has an optimum tip diameter 72 within the range of 6 to 12 mm, with 8 to 10 mm diameter tips fitting most individuals, while a 9 mm diameter tip being the ideal diameter. Several internal features of the mushroom shaped tip portion 62 are shown in the cut-away view of FIG. 17. The mushroom shaped tip portion 62 includes a spring 70 which can be formed integral with the earmold tip 60. The spring 70 can have a stiffness value that is consistent with a desired tip flexibility. For example, the stiffer the spring, the less flexible the mushroom shaped tip portion 62 relative to the vibration isolator portion 64. The spring 70 can also act to prevent the collapse of the sound bore 74 during bending. Alternately, a stiff material can be used to surround the sound bore 74, which can allow the tip 60 to flex but not collapse. The spring 70 can have an open coil construction which permits the flow of material between coils during the manufacturing process so as to retain the spring 70 in the earmold tip 60. Finally, with respect to the spring 70, the longitudinal compressibility of the spring 70 can enhance comfort during insertion into an ear canal of a user.

The vibration isolator 64 acts to retain the earmold tip 60 in the body of a hearing aid instrument, which results in a permanently mounted tip 60. The vibration isolator 66 includes a conical shape which can help secure the earmold tip 60 within the hearing aid. Adhesives can also be used to help retain the tip in the hearing aid.

Figure 18:
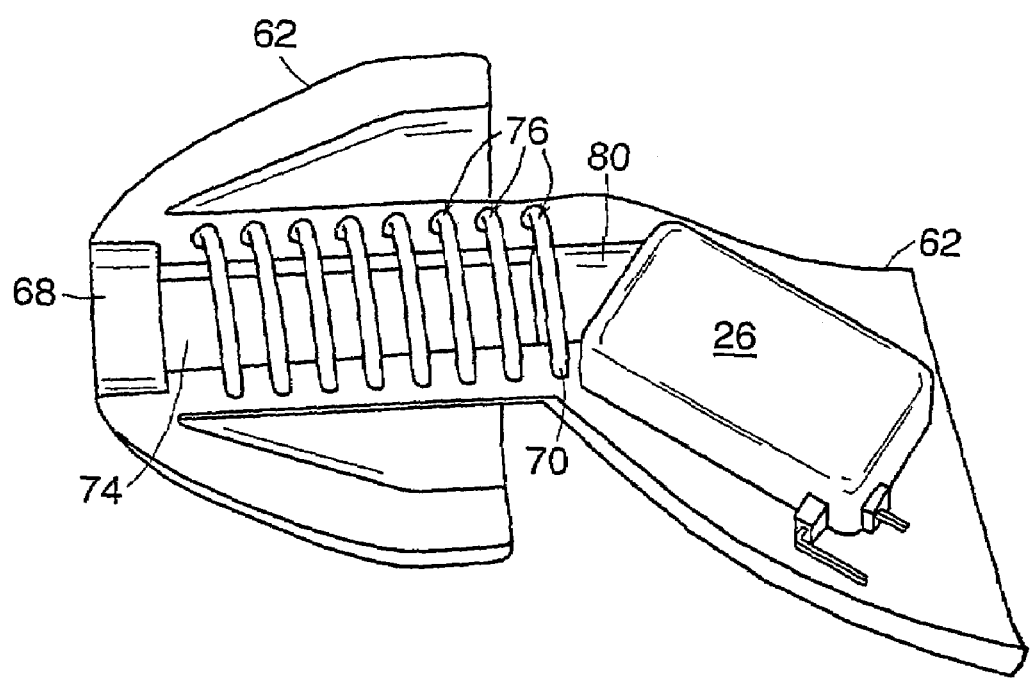

The vibration isolator 64 also acts to secure hearing aid components. The vibration isolator can include a nest 66 which houses and covers a receiver 26, as shown in FIG. 18. Alternately, the receiver 26 can be partially housed and covered by the vibration isolator 64. An adhesive can be used to secure and acoustically seal the receiver to the earmold tip 60. Once the receiver 26 is seated in its nest 66, the earmold tip 60 becomes more secure because of the subassembly created by the tip and receiver 26 combination. The receiver 26 is a relatively rigid component that is confined in the vibration isolator 64 and enclosed by the hearing aid. The permanent mounting of the earmold tip 60 to the hearing aid can alleviate the potential hazards associated with tip detachment in the ear.

The vibration isolation properties of the earmold tip 60 are due largely to the compliance of the tip material. Because of the compliance, the vibration isolator 64 can mechanically decouple the receiver 26 from the hearing aid. To illustrate, the receiver 26 includes a diaphragm such that when the receiver 26 generates sound, the diaphragm vibrates. The vibration of the diaphragm can, in turn, vibrate the receiver 26 itself. When a receiver 26 is rigidly mounted to a hearing aid, vibrations of the receiver 26 vibrate the hearing aid and its shell. Vibration of the hearing aid can create feedback within the hearing aid. Mechanical decoupling of the receiver 26 from the hearing aid can reduce this feedback phenomenon. The compliant hearing aid tip 60 absorbs vibrations from the receiver 26 caused by the vibration of the diaphragm within the receiver. The tip 60 therefore isolates the mechanical vibrations of the receiver 26 from the hearing aid, thereby mechanically decoupling each portion. To obtain an effective isolator, one must consider the mass of the object, such as the receiver, that is to be decoupled. By lowering the resonant frequency of receiver/nest system, the receiver vibrations are highly attenuated.

In addition to vibration isolation, the tip 60 provides sufficient acoustic isolation to attenuate unwanted feedback and associated oscillations during operation. Part of the isolation is obtained from a seal produced by the mushroom shaped tip 62 in conjunction with a given ear canal. Such a seal can produce an external acoustic isolation from external acoustic vibration for the hearing aid. For example, the receiver of the hearing aid sends sound to an ear drum. If the sound vibrations travel from the receiver and around the hearing aid and into the microphone of the hearing aid, feedback will result. A tip 60 having a mushroom shaped tip portion 62 can provide a seal which prevents sound vibrations from traveling around the hearing aid to the microphone. The feedback path from the output of the receiver to the microphone is attenuated by the mushroom shaped tip.

To prevent the sound from the receiver 26 from leaking internally to the microphone 30, soft material, by way of the isolation nest 66, can completely surround the receiver thereby attenuating internal acoustic vibrations transmitted from the receiver 26 to the microphone 30. Without the presence of acoustic isolation of the receiver 26, as the receiver 26 produces sound, the sound can leak from the output of the receiver 26, around the receiver 26, and back to the microphone 30 within the hearing aid itself. Such a sound leak can create feedback oscillations. Surrounding the receiver 26 with a compliant material, such as the nest 66, can eliminate any spaces around the receiver 26 through which sound can travel. The compliant material surrounding the receiver 26 acts as a gasket to provide a good acoustic seal for the receiver, thereby providing internal acoustic isolation. Alternately, to create internal acoustic isolation, the soft material could partially enclose the receiver, with an adhesive used to complete the seal.

Figure 19:
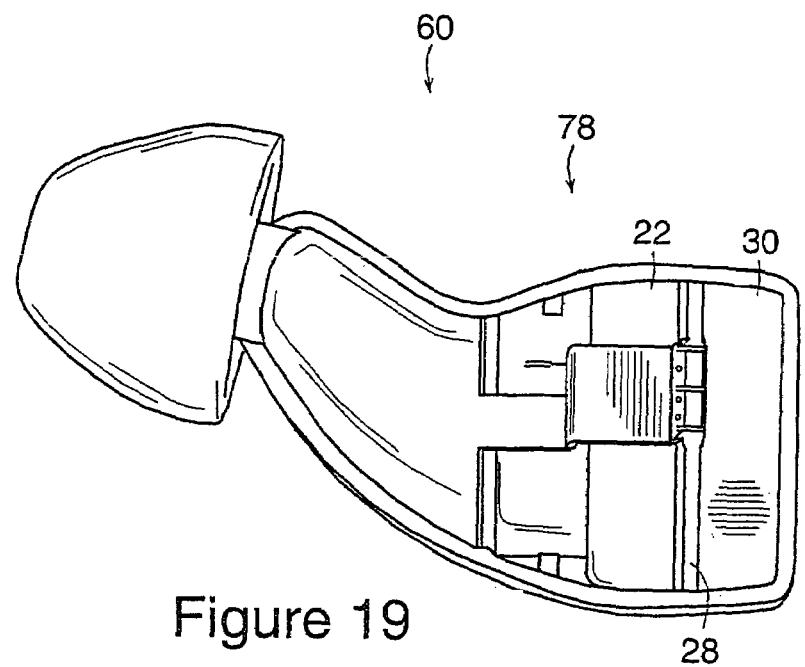
FIG. 19 shows a cross-sectional view of a hearing aid having a flexible earmold tip as illustrated in FIGS. 14–16.
Figure 20:
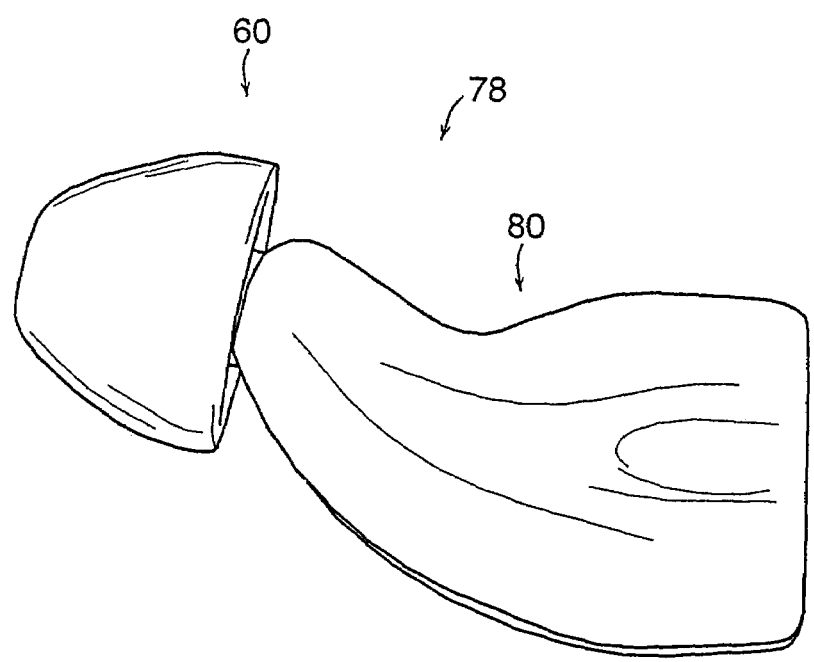
FIG. 20 shows a hearing aid having a flexible earmold tip as illustrated in FIGS. 14–16.

FIGS. 19 and 20 show the tip 60 mounted in a hearing aid 78. FIG. 19 shows a hearing aid base unit having internal components, such as a battery 22, microphone 30, and electronics 28. The earmold tip 60 is mounted within the base unit such that the receiver can electronically connect to the electronics 28. FIG. 20 depicts an assembled hearing aid 78. The hearing aid 78 includes a hearing aid base unit 80 and a tip 60. The tip 60 is clamped between two half-shell portions of the hearing aid base unit 80.

Mechanical feedback in a hearing aid can also be reduced by potting the inside of hearing aid with a material that increases the mass of the hearing aid. Potting the inside of the hearing aid can embed the components of the hearing aid, such as a receiver, a microphone, electronics, controls and a battery, within a material. The potting material can form an acoustical barrier inside the hearing aid between the receiver and the microphone. The material can also be used to pot a portion of the inside of the hearing aid base unit. The potting material used to reduce mechanical and acoustical feedback can be epoxy, for example.

An increase in mass of the hearing aid can help to attenuate vibrations created by the receiver during operation, thereby preventing the vibrations from being conducted to a portion of the hearing aid shell near the hearing aid microphone and causing mechanical feedback oscillation. The increase in mass can also reduce acoustical feedback by creating a blocking wall so as to prevent the acoustical vibration energy created by the receiver from traveling through air inside the hearing aid housing. The potting material can also increase the stiffness of the base unit, thereby raising its resonant frequencies above the typical feedback oscillation frequency range to reduce feedback in the hearing aid.

Potting the inside of a hearing aid to prevent the transmission of mechanical vibration and acoustical energy has not been performed previously. A hearing aid which is potted renders any required repairs on the hearing aid as very expensive, since the repairer would have to work through the potting material to reach the components to be repaired or replaced. Therefore, by virtue of a hearing aid being potted, the hearing aid must be disposed once a component of the hearing aid has failed. If the hearing aid is intended to be disposable, potting is an effective solution to feedback problems.

FIGS. 21–24 illustrate a disposable hearing aid having a compliant tip 90. The disposable hearing aid with a compliant tip 90 includes a hearing aid 92 having a hard shell, which contains the battery and all of the electronics, and a compliant tip 94 that can penetrate deep into an ear canal and is attached to the hearing aid 92 by a flexible core 96.

Figure 21:
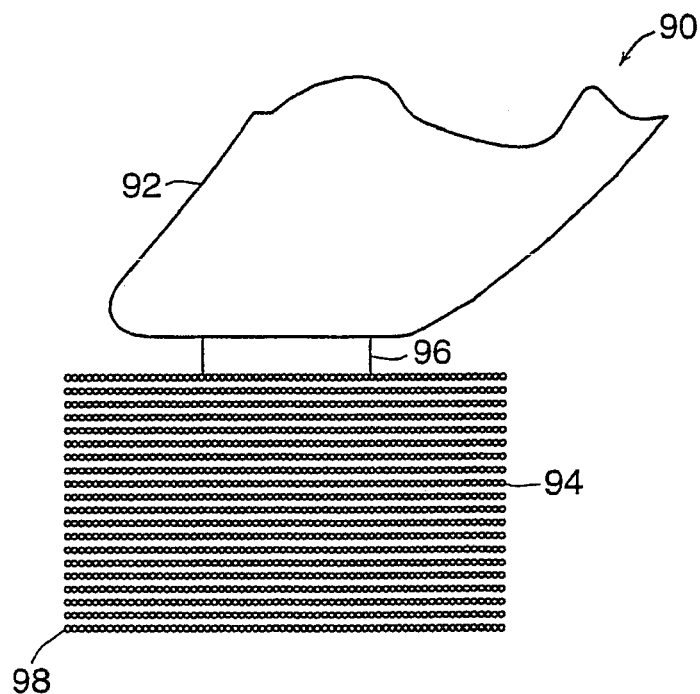
FIGS. 21–24 illustrate a disposable hearing aid having a compliant tip.
Figure 22:
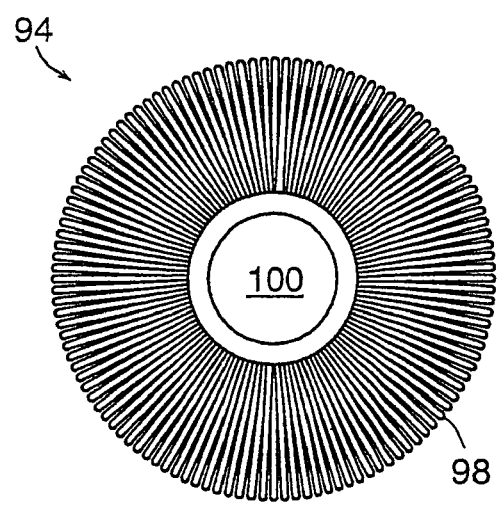

The compliant tip 94 can consist of many layers of thousands of tiny fingers 98 arranged around a flexible core 96, as shown in FIGS. 21 and 22. The fingers 98 can be made from a soft elastomer such as silicone rubber, for example. The fingers 98 can also be formed into a round or rectangular cross section, shown in FIG. 22. When the fingers 98 of the tip 94 slide into an irregular shaped ear canal, the fingers 98 can bend, twist, or interleave to form an acoustic seal to separate an inner and outer area of the ear canal. The flexible core 96 at the center of the fingers 98 of the tip 94 is hollow, thereby forming a sound bore 100. The sound bore 100 allows amplified sound to pass through the tip 94 to the inner ear. The flexible core 96 can accommodate any angle change in the ear canal while the fingers 98 can accommodate any size or shape change in the ear canal.

Figure 23:
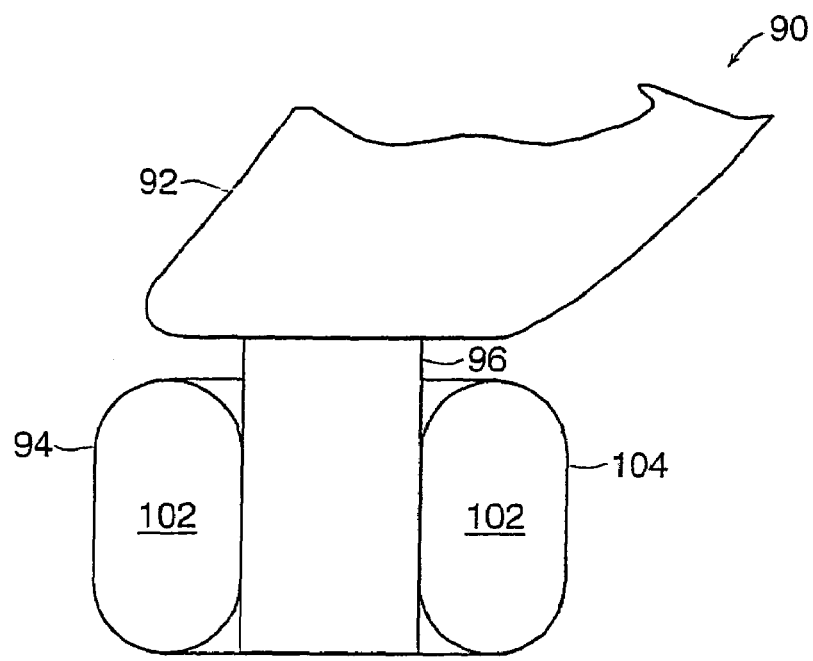
Figure 24:
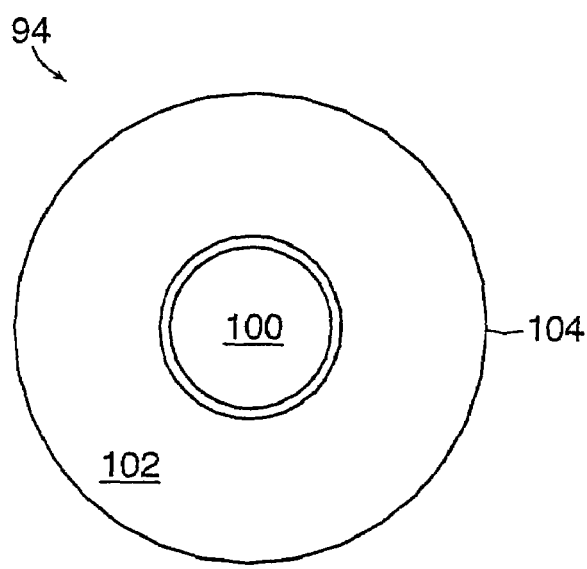

The compliant tip 94 can also consist of a fluid filled bladder 102 around the flexible center core, as shown in FIGS. 23 and 24. The bladder can have a donut-like shape. The fluid within the bladder 102 can be air or liquid, for example. If the bladder 102 is filled with air, when the tip 94 is placed within an ear canal and the tip 94 is deformed, the air can compress and force the thin bladder walls 104 to stretch to accommodate various ear canal shapes and sizes. If the bladder 102 is filled with a liquid, such as water, the water will flow to accommodate shape changes of the canal. However, when liquid is used to fill the bladder 102, the walls 104 of the bladder 102 must be flexible enough to stretch to accommodate size changes. The liquid can contain a jelling agent to prevent any feeling of liquid sloshing in the user. The fluid filled bladder 102 can fill a void smoothly, rather than buckle like solid rubber rings when the rings enter a cavity which is much smaller than the diameter of the ring.

Figure 25:
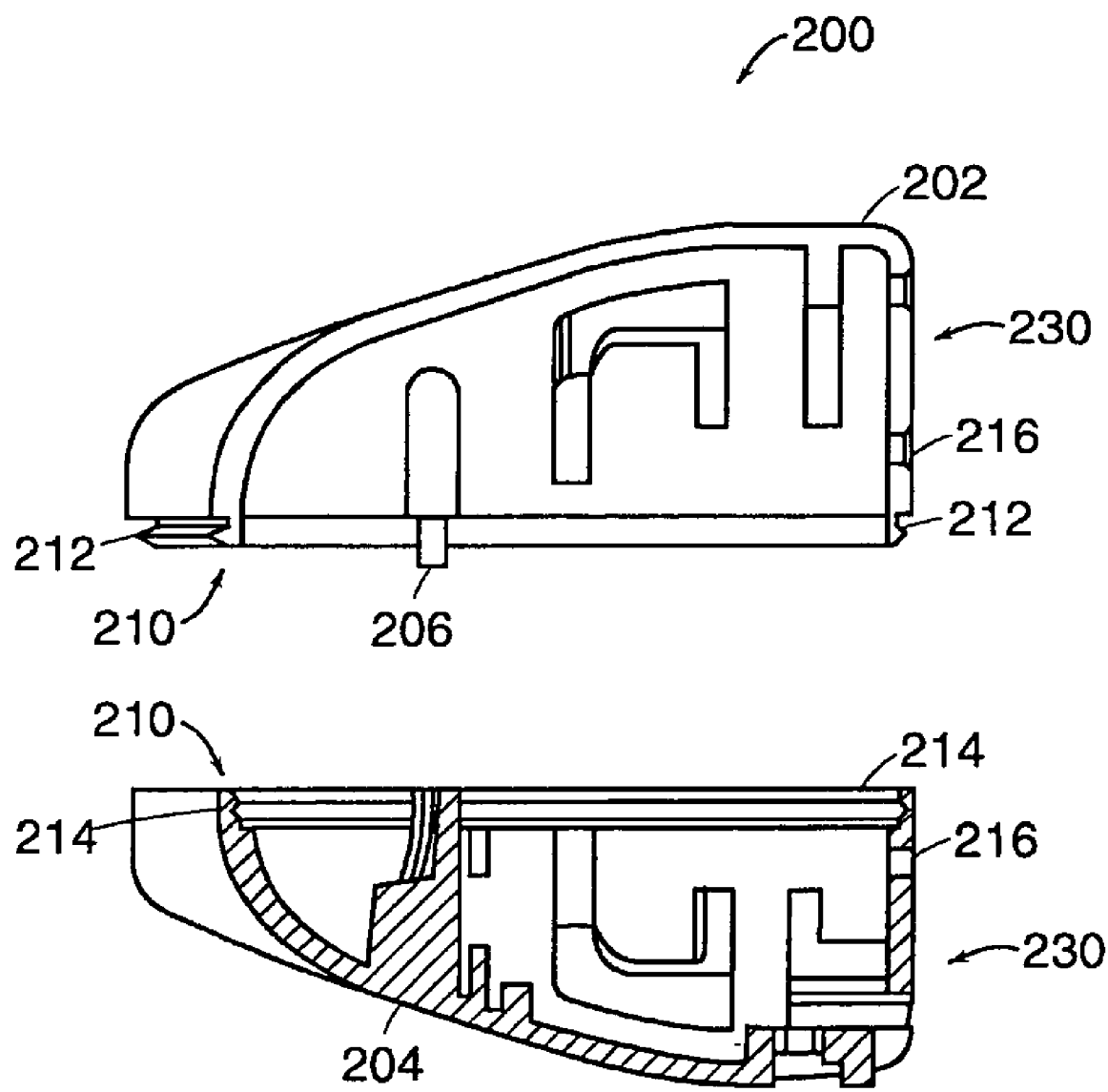
FIG. 25 illustrates a cross-sectional view of two shell halves for a hearing aid.
Figure 26:
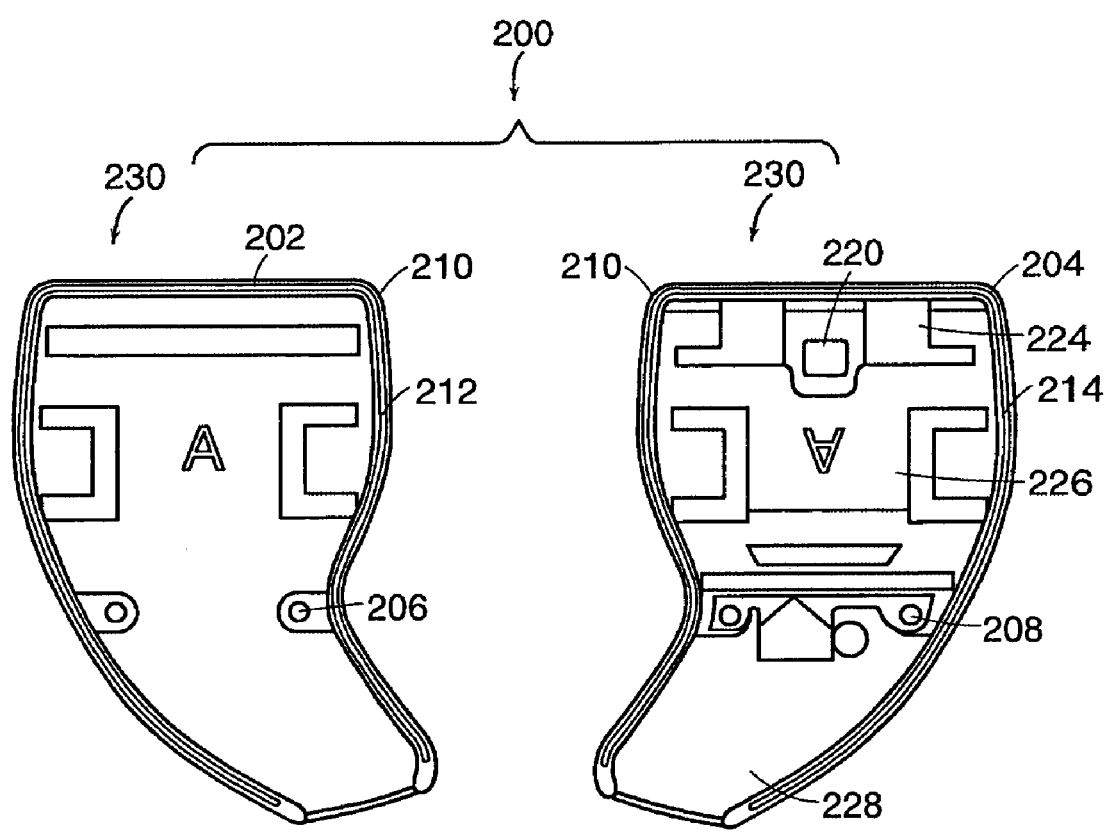
FIG. 26 shows a top view of two shell halves for a hearing aid.
Figure 27:
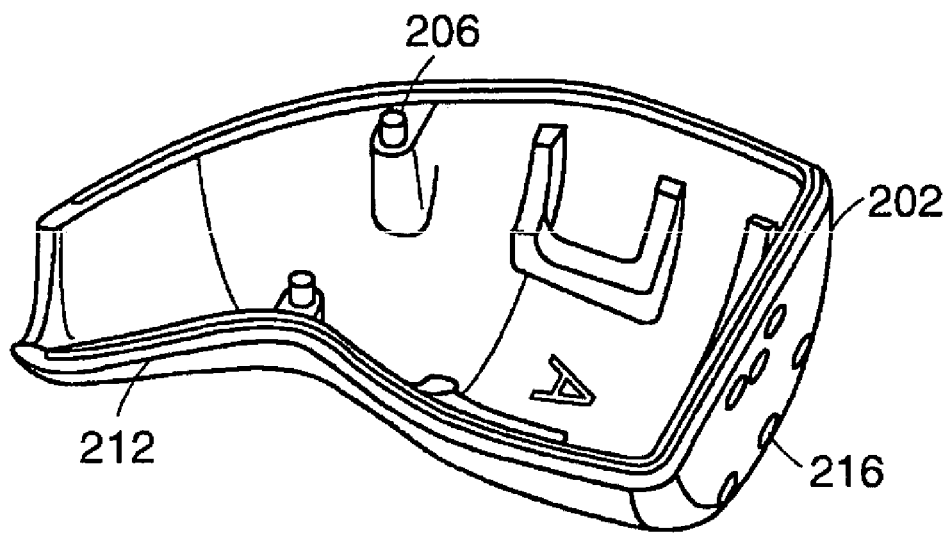
FIGS. 27 and 28 illustrate perspective views of the top shell portion of FIG. 25.
Figure 28:
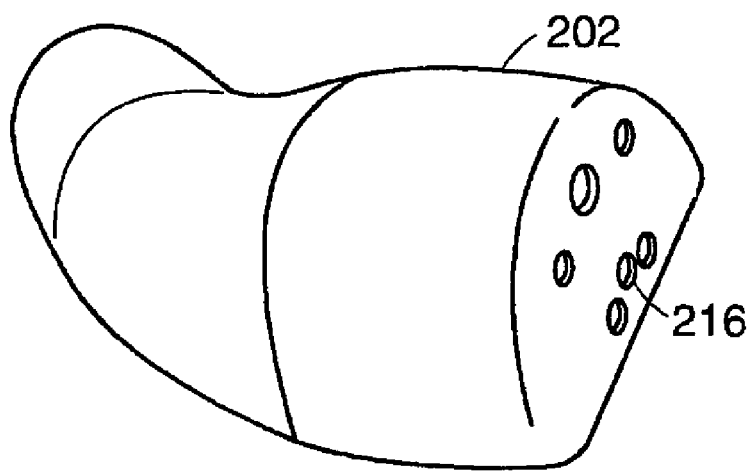

FIGS. 25 though 30 illustrate a housing for a hearing aid, given generally as 200. The housing 200 includes a first or top half shell 202 and a second or bottom half shell 204. The shells 202, 204 include a securing mechanism 210. The securing mechanism 210 is preferably mechanical, such as an interlocking joint, and secures the top shell 202 to the bottom shell 204. An adhesive or bonding agent can be used to permanently secure the shells 202, 204 together. Preferably, the securing mechanism 210 is located around the entire perimeter of the half shells 202, 204. The securing mechanism 210 allows the shells 202, 204 to hold various hearing aid components within the housing 200 of a hearing aid.

Figure 31:
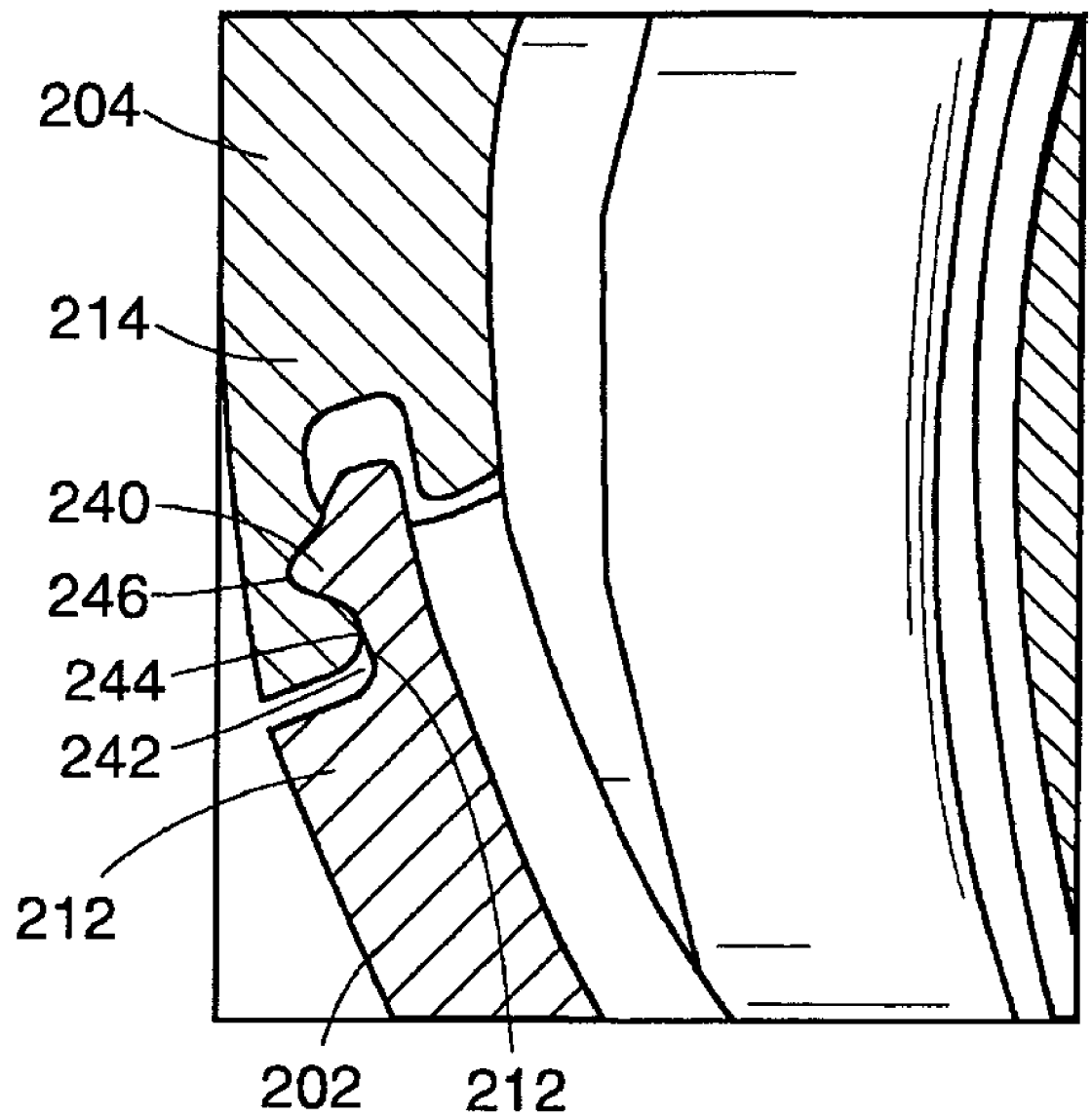
FIG. 31 shows a securing mechanism between the top shell portion and the bottom shell portion of FIG. 25.
Figure 32:
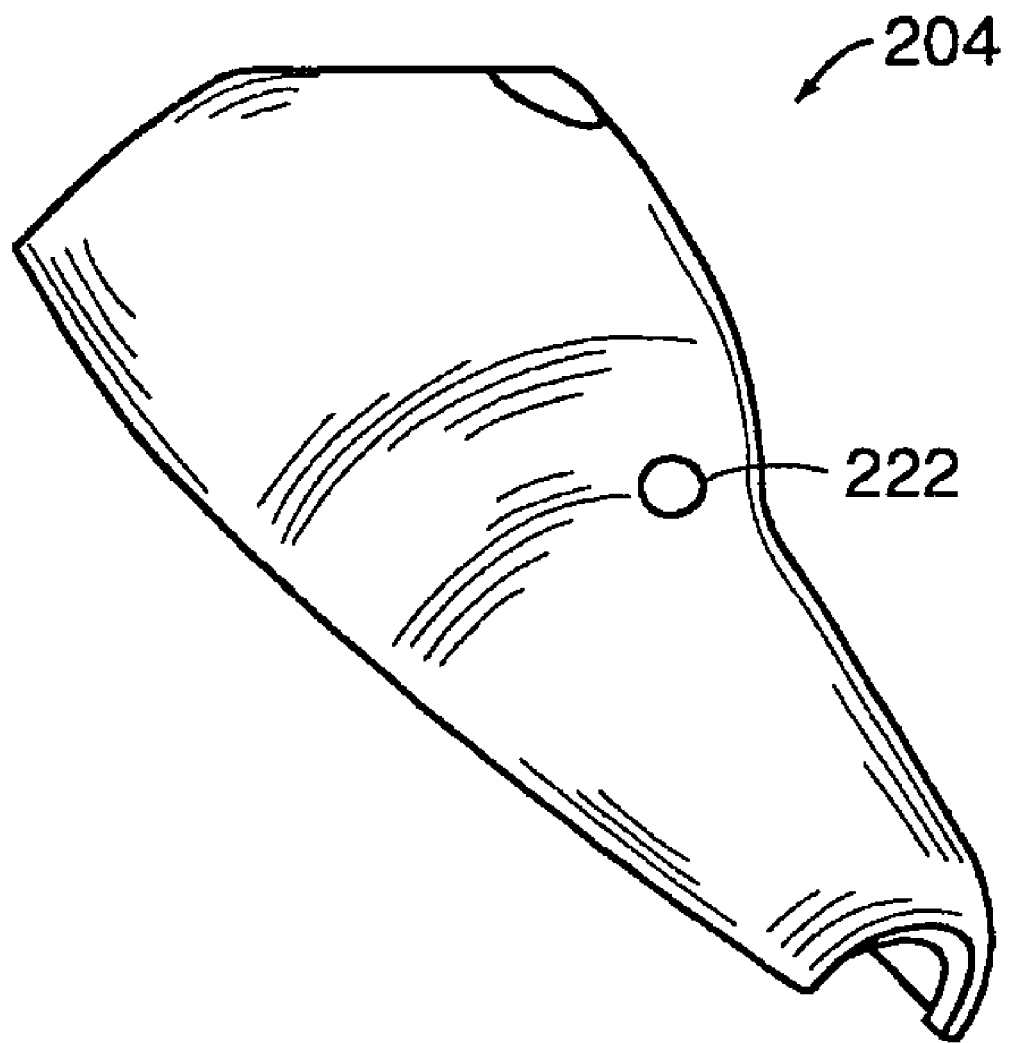
FIG. 32 illustrates an epoxy aperture located in a hearing aid shell.

FIG. 31 illustrates a cross sectional view of the securing mechanism 210 in an engaged state. The first half shell 202 includes a first securing portion 212 having a first protrusion 240 and a first receptacle 242. The second half shell 204 includes a second securing portion 214 having a second protrusion 244 and a second receptacle 246. When the first securing portion 212 is mated to the second securing portion 214, the first protrusion 240 engages the second receptacle 246 and the second protrusion 244 engages the first receptacle 242, thereby securing the two shells 202, 204. Preferably, the securing mechanism 210 is an interlocking joint.

The top shell 202 includes a guide protrusion 206 that engages a guide receptacle 208 located on the bottom shell 204. The guide protrusion 206 and guide receptacle 208 ensure proper alignment of the top 202 and bottom 204 shells prior to engagement of the securing mechanism 210.

Figure 29:
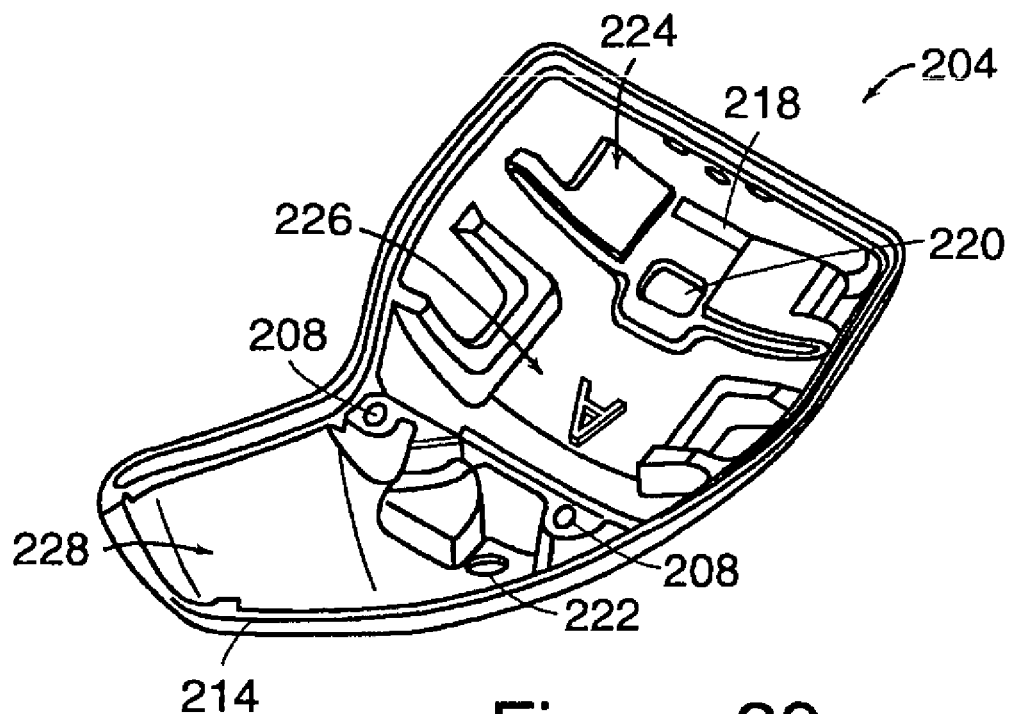
FIGS. 29 and 30 illustrate perspective views of the bottom shell portion of FIG. 25.
Figure 30:
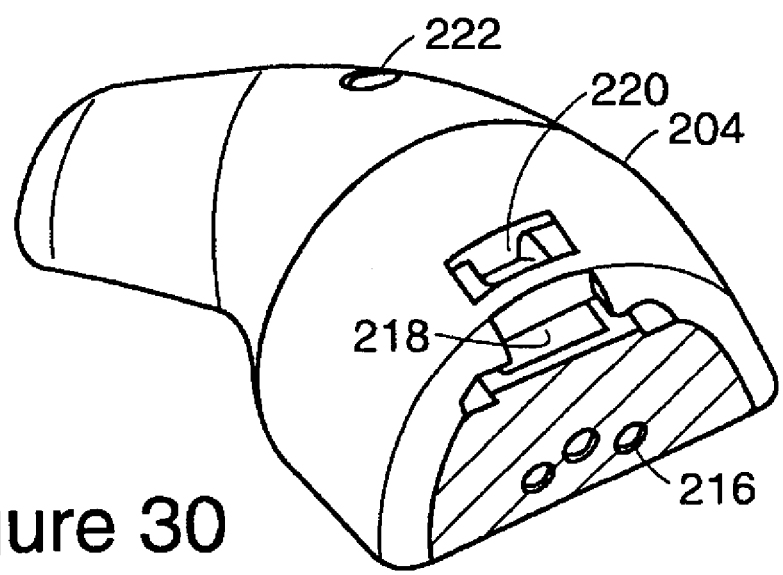
Figure 33:
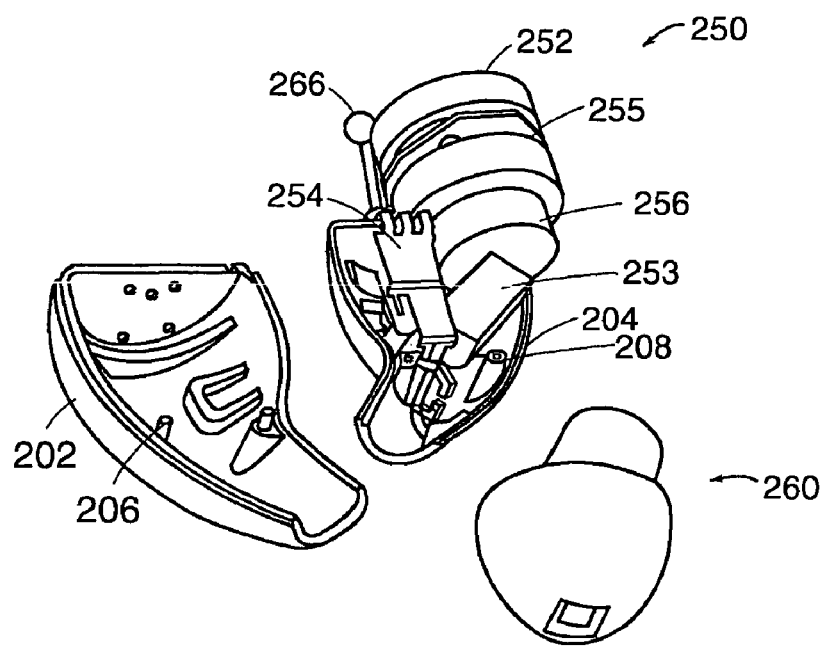
FIGS. 33 and 34 illustrate exploded views of a hearing aid assembly.
Figure 34:
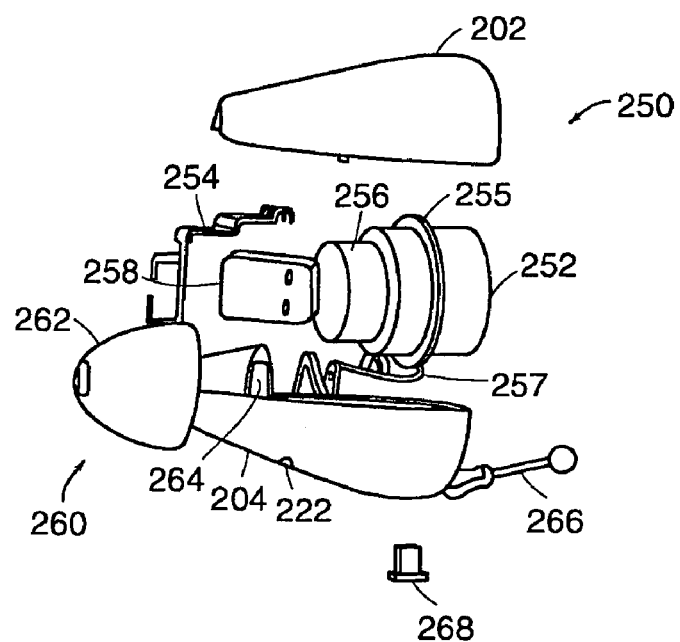

FIGS. 33 and 34 illustrate the assembly of a hearing aid 250. Preferably, automated assembly techniques are used to form the hearing aid 250. The bottom half shell 204 includes a microphone receptacle 224, a battery receptacle 226 and a flexible tip and receiver receptacle 228, shown in FIG. 29. The bottom shell 204 also includes an actuator aperture 218 and an actuator stop aperture 220 as illustrated in FIG. 30. During assembly, a microphone 252 and circuit board 255 are inserted into the microphone receptacle 224 and a battery 256 is inserted into the battery receptacle 226. A flexible tip 260 having a mushroom shaped tip and an isolation nest 264 is provided. A receiver 258 is inserted within the isolation nest 264 and the flexible tip 260 and receiver 258 combination is placed within the flexible tip and receiver receptacle 228. Wire harness 254 electrically connects the electrical components within the bottom shell 204. An actuator 266 is inserted within the actuator aperture 218 and operates a switching mechanism 257 which engages the hearing aid 250 in an ON or OFF mode of operation. An actuator stop 268 is placed within the actuator stop aperture 220. The actuator stop 268 prevents the actuator 266 from being removed from the hearing aid 250.

Figure 35:
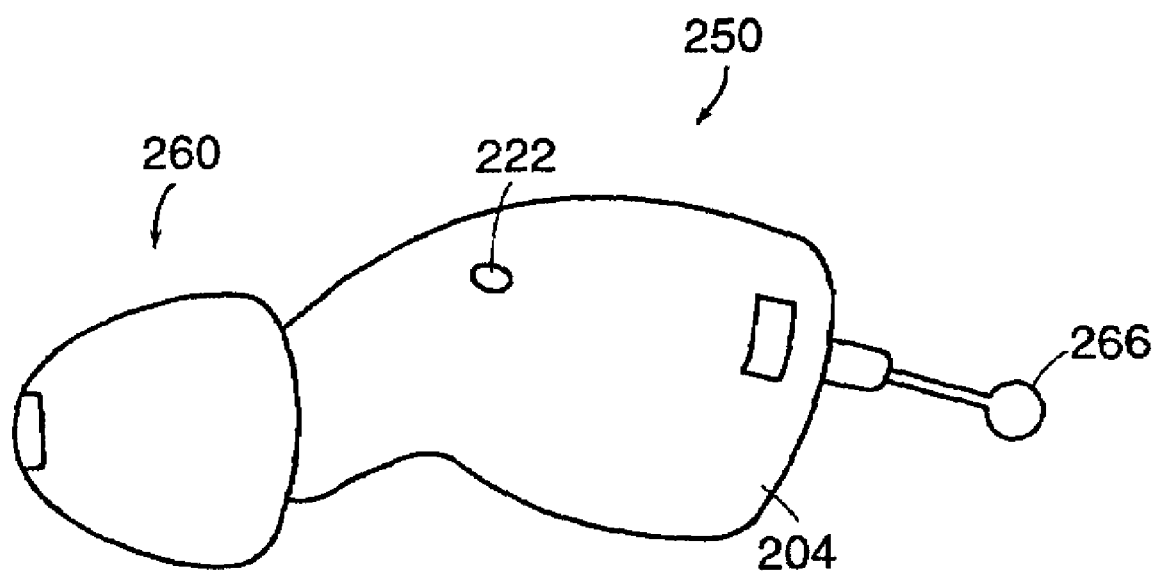
FIG. 35 shows the assembled hearing aid of FIGS. 33 and 34.

After the components are placed within the bottom half shell 204, the top half shell 202 is aligned with the bottom half shell 204 using the guide protrusions 206 and guide receptacles 208. The top 202 and bottom 204 shells are then joined using the securing mechanism 210 which holds the hearing aid 250 together and the internal components in place. The assembled hearing aid 250 is illustrated in FIG. 35. Preferably, this hearing aid 250 is an in-the-canal (ITC) hearing aid and is disposable.

The bottom shell 204 also includes an adhesive aperture 222 shown in FIG. 8 to allow introduction of an adhesive or potting material within the hearing aid 250. The adhesive is used to pot all of the internal components of the hearing aid 250 in order to minimize acoustic and mechanical feedback created by the components in the hearing aid 250. Preferably, a rapidly curing epoxy is used as the adhesive in order to pot the components after assembly without slowing the flow of production.

Figure 36:
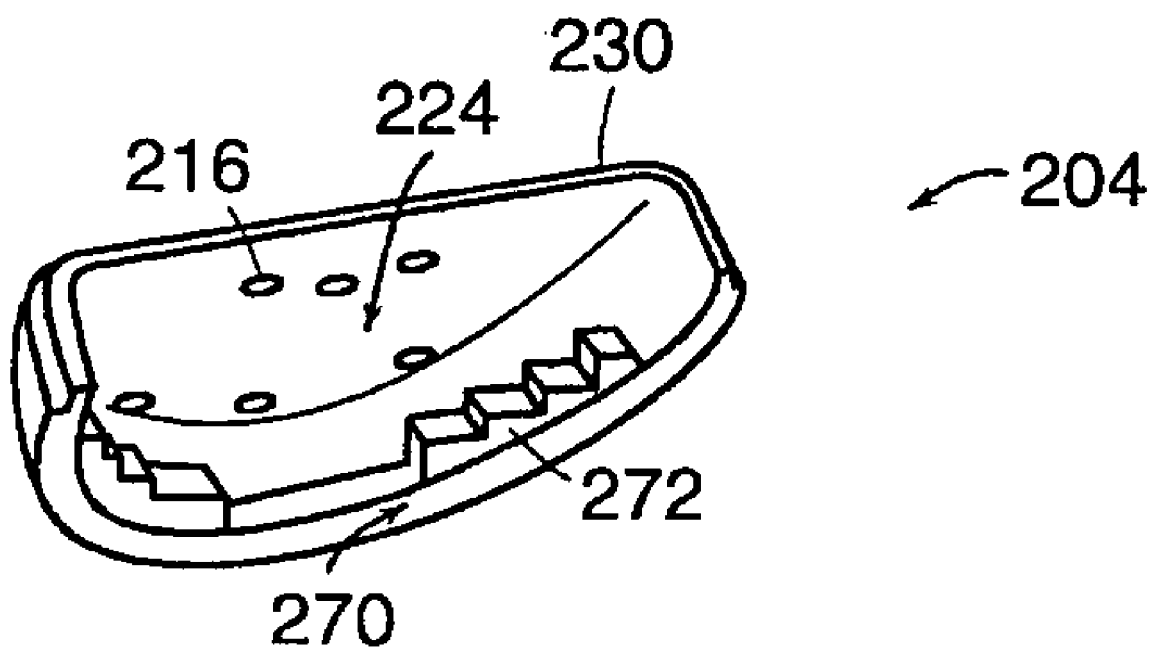
FIG. 36 shows a microphone retention device.
Figure 37A:
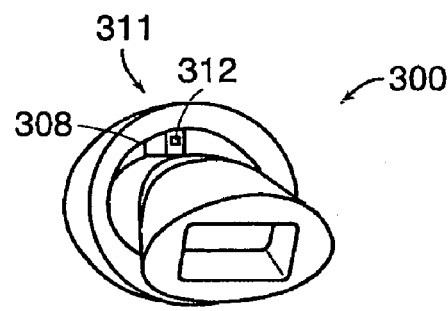
FIGS. 37A–37B through FIGS. 42A–42D illustrate embodiments of a vent formed within a flexible tip for a hearing aid.
Figure 37B:
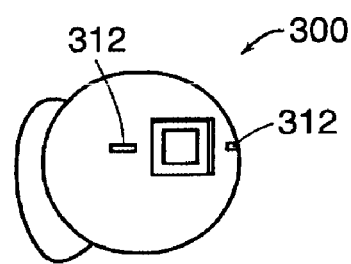

The top 202 and bottom 204 shells include microphone apertures 216 located in the faceplate 230 to allow acoustic waves to penetrate the hearing aid housing and cause the microphone 252 to produce a signal that is transferred to the receiver 258. During assembly, when the microphone 252 is placed within the microphone receptacle 224, any space formed between the microphone 252 and the faceplate 230 can result in undesirable resonances in the acoustic frequency response of the hearing aid 250 and possibly oscillation. To prevent this phenomenon, the hearing aid 250 includes a microphone retainer 270 that secures the microphone 252 flush against the faceplate 230, as illustrated in FIG. 36. Preferably, the microphone retainer 270 includes a lip or protrusion 272 that forces the microphone against the faceplate 230. The lip 272 can be a continuous structure or can be formed from a plurality of protrusions or teeth. Alternately, the microphone retainer can be an adhesive that seals the microphone 252 to the faceplate 230 of the hearing aid 250.

Figure 49:
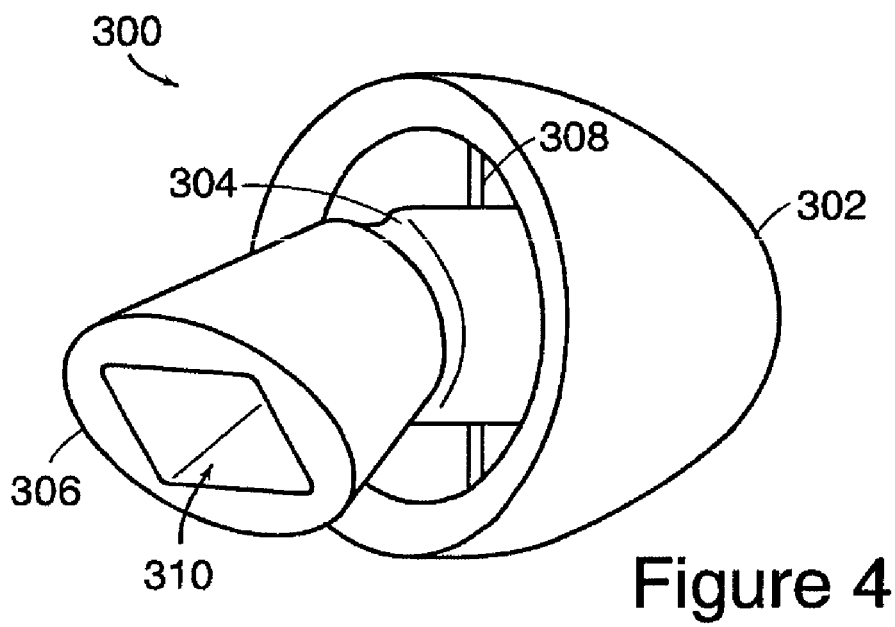
FIG. 49 illustrates a flexible tip for a hearing aid.

FIG. 49 illustrates a flexible tip for a hearing aid, given generally as 300. The flexible tip 300 includes a tip portion formed as a mushroom shaped tip 302, a sound bore 304 and a body 306. The mushroom shaped tip 302 includes a rib 308 to provide stability. The body 306 includes an isolation nest 310 to house a receiver, as described above.

In order to minimize the pressure created in an ear canal when the flexible tip 300 is inserted into a hearing canal or to minimize the partial vacuum created in an ear canal when the flexible tip 300 is removed, the tip 300 can include a vent to provide static pressure equilibrium. The vent can be formed of a diameter and a relatively long length that provides static pressure equilibrium and minimizes or prevents feedback. Preferably, the vents have a diameter between 0.4 mm (0.016 in.) and 0.8 mm (0.032 in.). Alternately, the apertures 312 can be filled with a porous sound absorbing material that allows the tip 300 to achieve static pressure equilibrium while minimizing or preventing feedback. The porous sound absorbing materials can include foam, felt or wool, for example.

FIGS. 37–42 illustrate embodiments for a vent, given generally as 311, formed within the tip 300. FIGS. 37A through 37D illustrate a vent 311 in a flexible tip 300, wherein the vent 311 is formed as an aperture 312 within the rib 308 of the tip 300. Preferably, the tip 300 includes two such apertures 312, one for each support rib 308 within the tip 300. The apertures 312 can be either rectangular shaped, as shown in FIGS. 37A and 37B, or can be round shaped, as shown in FIGS. 37C and 37D.

Figure 38A:
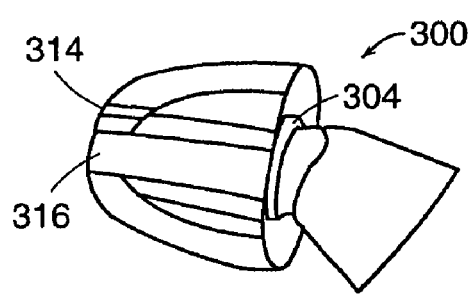
Figure 38B:
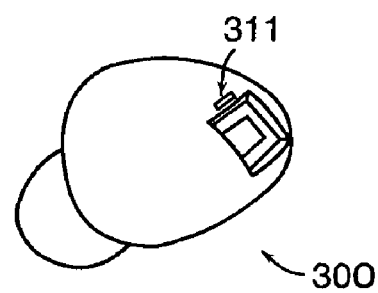
Figure 37C:
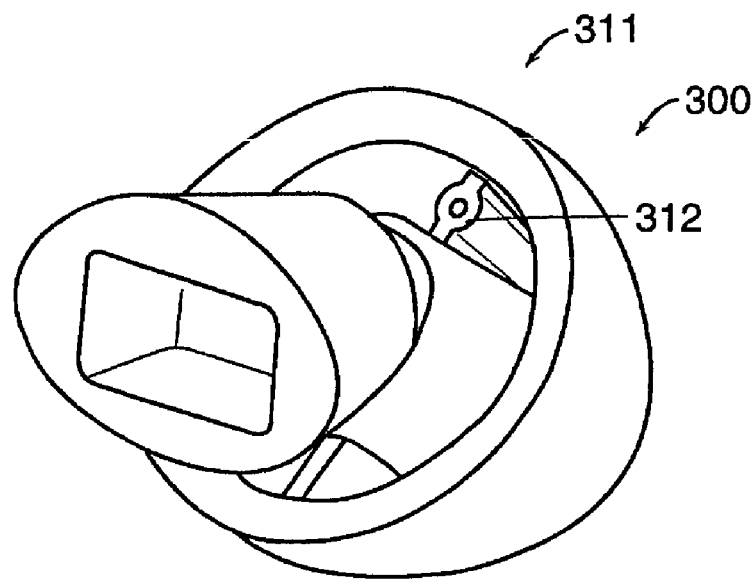
Figure 37D:
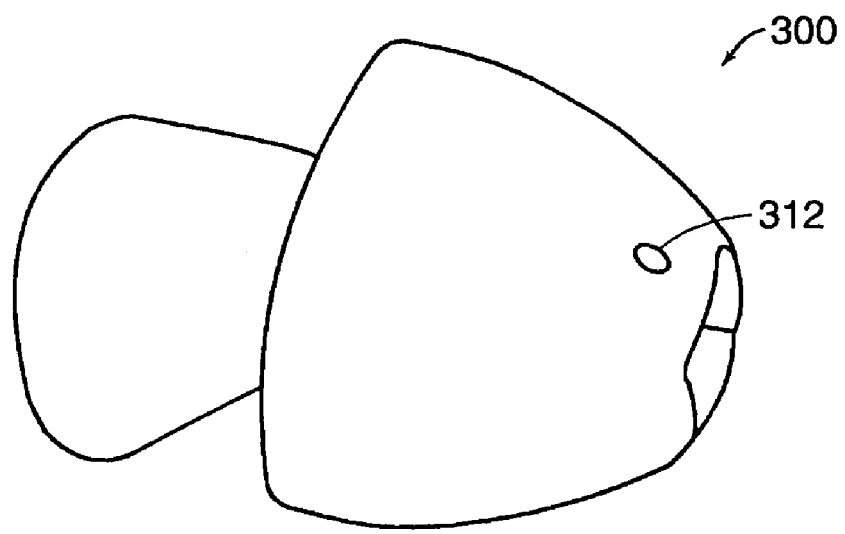

FIGS. 38A and 38B illustrate the vent 311 as an aperture 314 located parallel to the sound port 304 in the tip 300. While illustrated as being rectangular, the aperture 314 can also be formed as a circular shape. In this embodiment, the aperture 314 is not located within the rib 308 of the tip 300.

Figure 39:
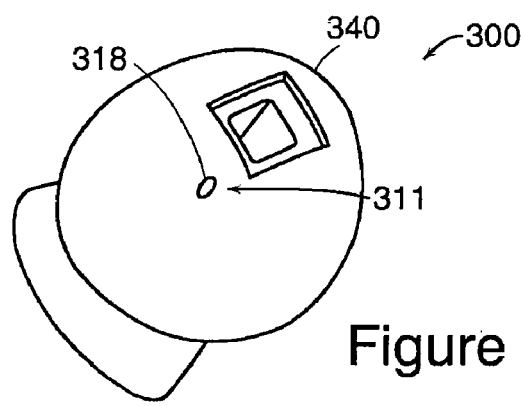
Figure 40A:
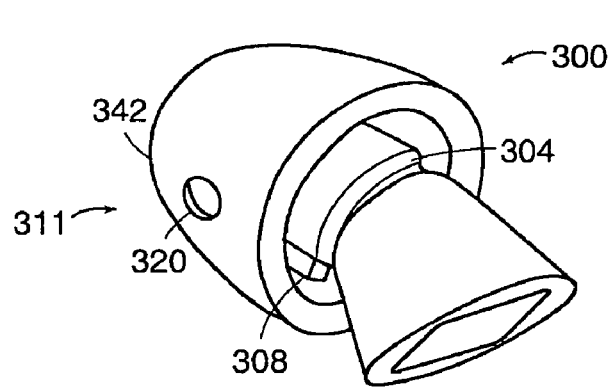
Figure 40B:
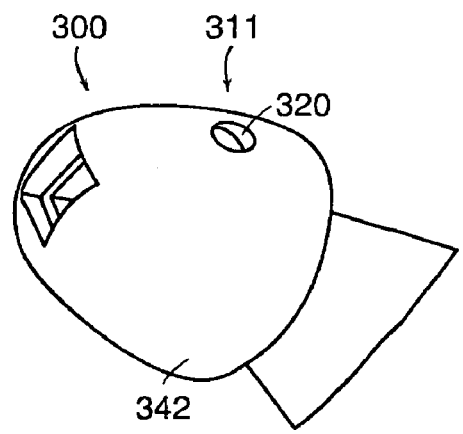

FIG. 39 shows the vent 311 as an aperture 318 located in a top portion 340 of the mushroom shaped portion 302 of the tip 300. FIGS. 40A and 40B show the vent 311 as an aperture 320 located on a side portion 342 the mushroom shaped portion 302 of the flexible tip 300. Preferably, the apertures 318, 320 are located approximately 90° from the longitudinal axis of the ribs 308 or sound port 304. This allows the function of both the ribs 308 and the apertures 318, 320 to be optimized. For example, with the apertures 318, 320 located in the mushroom shaped tip 302, the apertures can provide static pressure equilibrium while the stiffness of the ribs 308 is not decreased.

Alternately, in FIGS. 41A–41B and 42A–42D, the vent 311 can be formed as part of the sound port 304 of the tip 300. When a vent 311 is located in the mushroom shaped tip 302, the vent 311 can become clogged with cerumen, thereby decreasing its effectiveness. Locating the vent 311 in the sound port 304 decreases the probability that the vent can become clogged with cerumen.

Figure 41A:
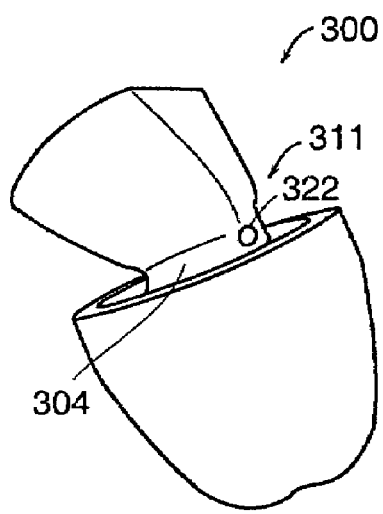
Figure 41B:
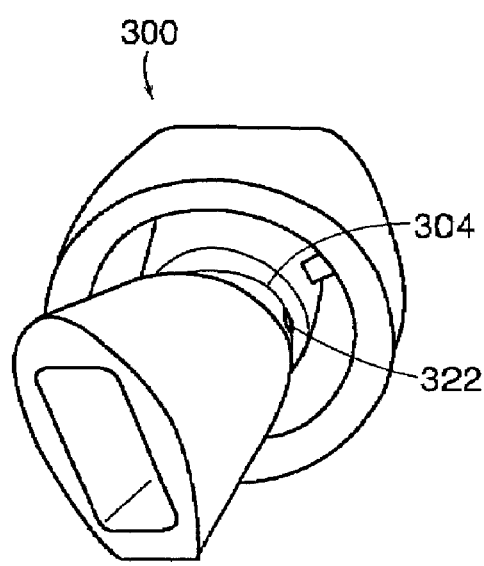
Figure 42A:
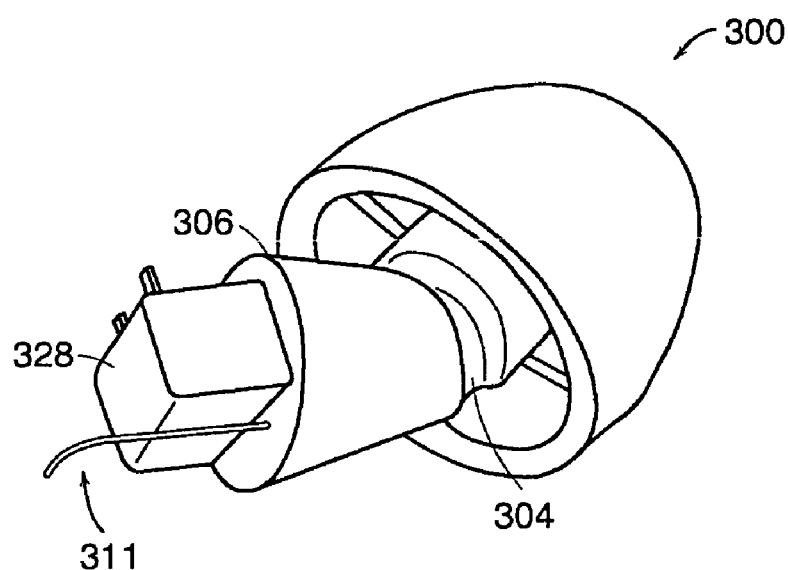
Figure 42B:
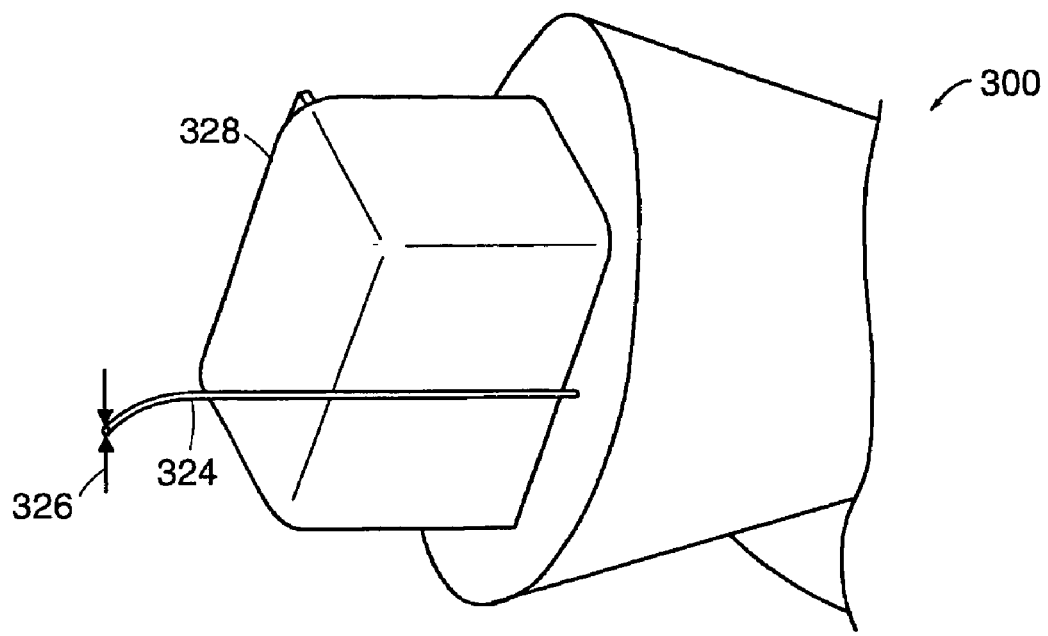
Figure 42C:
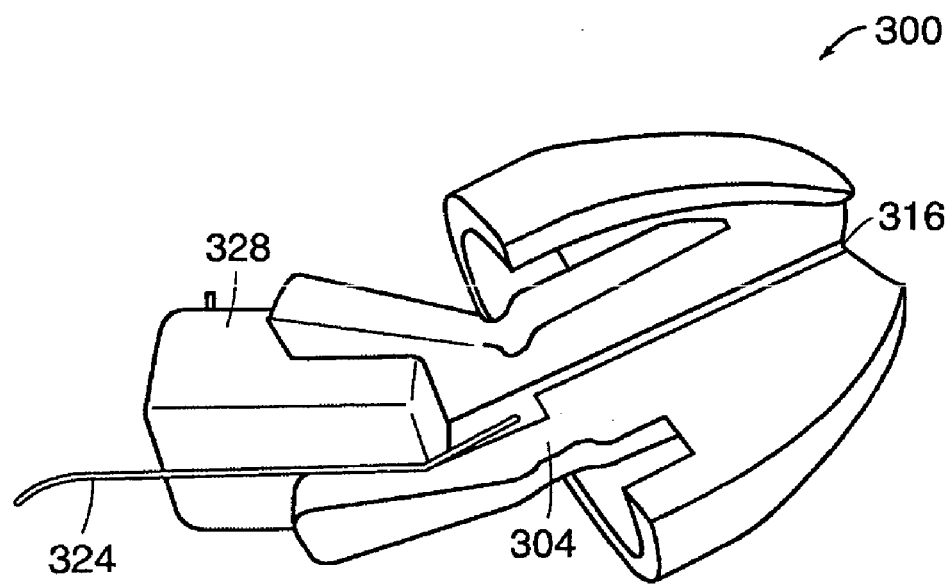

FIGS. 41A and 41B illustrated the vent 311 as an aperture 322 located in the sound port 304 of the tip 300. FIGS. 42A through 42C show the vent 311 in the sound port 304 as a capillary or hypodermic tube 324. The capillary tube 324 can be formed of a metal material and can have an outer diameter 326 of 4.25 mils and an inner diameter of 2.5 mils, for example. The tube 324 can be mounted to a receiver 328 or molded into the tip 300. The tube 324 contacts a bore 316 within the sound port 304 to provide static pressure equilibrium. The tube 324 also has a length that acts as an acoustical impedance that prevents oscillations caused by acoustical feedback.

Figure 42D:
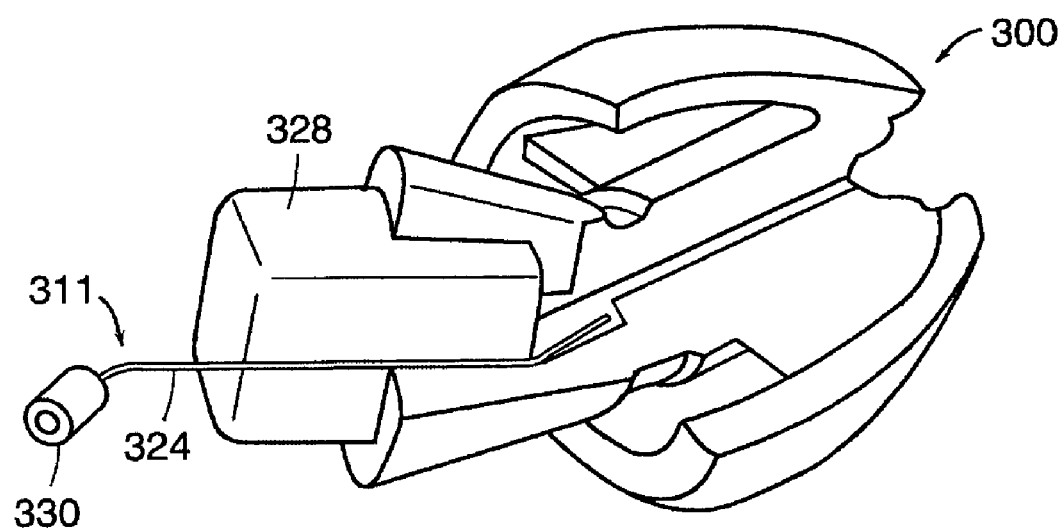

FIG. 42D illustrates a valve 330, such as a ball check valve, attached to the tube 324. A ball check valve having 20 mil balls with a sphericity of 0.2 mils is preferred. The valve 330 closes the tube 324 after the tip 300 is inserted into an ear canal. Removing the tip 300 from the ear canal opens the valve 330 and creates a pressure equilibrium through the tube 324 and between the ear canal and the external ambient pressure. Alternately, the tip 300 can include a switch used in conjunction with the tube 324 as a valve. For example, engagement of the switch can pinch the tube 324 to seal or close the tube 324 from the ambient pressure. Conversely, disengagement of the switch can open the tube 324 to ambient pressure.

FIGS. 43A and 43B through 45A and 45B illustrate vents 311 formed on the surface of the mushroom shaped tip 302. These vents 311 are formed as slots or channels 332 on the mushroom shaped tip 302. The channels 332 create openings between an ear canal and the mushroom shaped tip 302 to equalize the air pressure within the ear canal to the external ambient pressure.

Figure 43A:
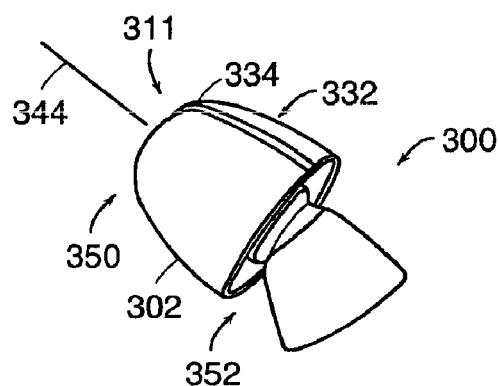
FIGS. 43A–43B through FIGS. 46A–46B show embodiments of a vent formed on a flexible tip for a hearing aid.
Figure 43B:
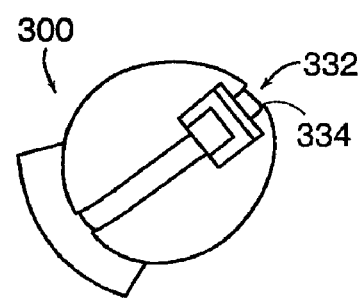
Figure 45A:
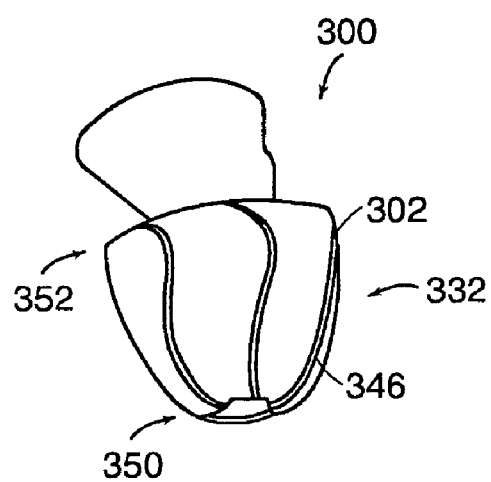
Figure 45B:
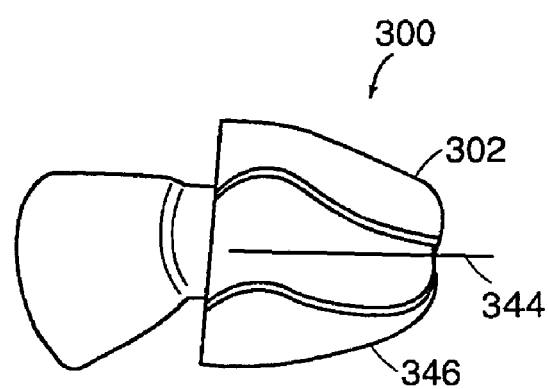

FIGS. 43A–43B and 45A–45B illustrate channels 332 formed on the surface of the mushroom shaped tip 302. The channels 332 can be formed through a molding process, for example. The channels 332 are parallel to the longitudinal axis 344 of the mushroom shaped tip 302 and are formed along the entire length of the mushroom shaped tip 302. For example, FIGS. 43A and 43B show the channel 332 formed as a rectangular shape 334 while FIGS. 45A and 45B illustrate the channels 332 formed as a serpentine shape 346. Alternately, the channels 332 can be formed as having a helical shape. The channels 332 are formed from a proximal end 350 to a distal end 352 of the mushroom shaped tip 302.

Figure 44A:
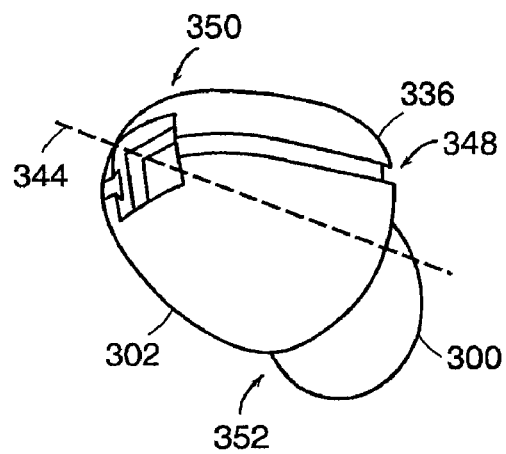
Figure 44B:
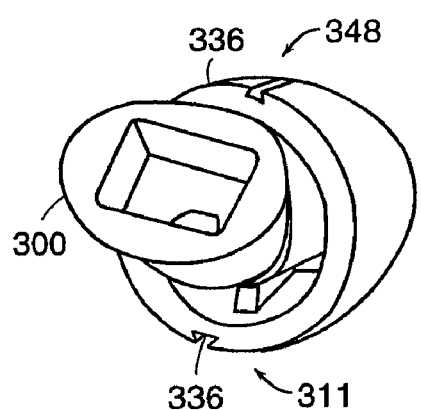

FIGS. 44A and 44B illustrate channels 348 that are parallel to the longitudinal axis 344 of the mushroom shaped tip 302 and are formed over only a portion of the length of the mushroom shaped tip 302. For example, FIGS. 44A and 44B illustrate the channel 348 as having a triangular shape 336. Partial channels 348 having different shapes can also be used.

Figure 46A:
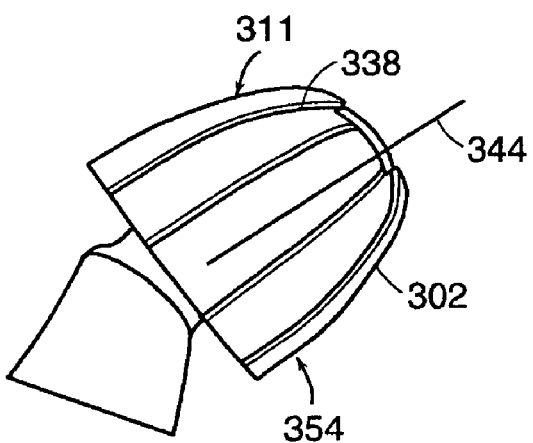
Figure 46B:
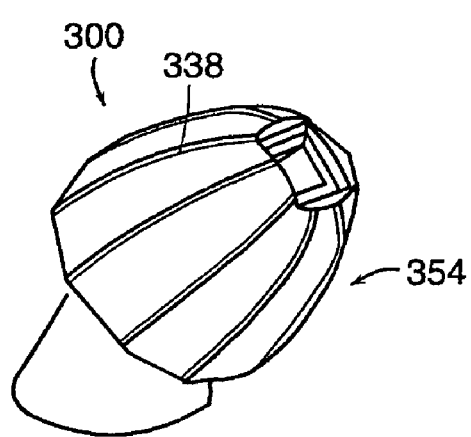

FIGS. 46A and 46B illustrate an alternate vent 311 formed on the mushroom shaped tip 302. The vent 311 is formed by a surface roughness 354 on the mushroom shaped tip 302. Similar to the channels 332, the surface roughness 354 also creates openings between an ear canal and the mushroom shaped tip 302 to equalize the air pressure within the ear canal to the external ambient pressure.

Preferably, the surface roughness 354 is formed as ridges 338 on the mushroom shaped tip 302. Preferably, the ridges 338 are parallel to the longitudinal axis 344 of the mushroom shaped tip 302 and are formed along the entire length of the mushroom shaped tip 302. Alternately, the ridges 338 can be formed over only a portion of the length of the mushroom shaped tip 302.

FIGS. 47A–47B and 48A–48C show embodiments of a valve 360 located in the tip 300. The valve 360 regulates the air entering and exiting an ear canal. When the flexible tip 300 is inserted into or removed from an ear canal, the valve 360 flexes to an open position to allow for pressure equalization between an ear canal and the external ambient pressure. Once inserted into the ear canal, preferably, the valve is engaged in a closed position that minimizes the possibility of feedback within a hearing aid.

Figure 47A:
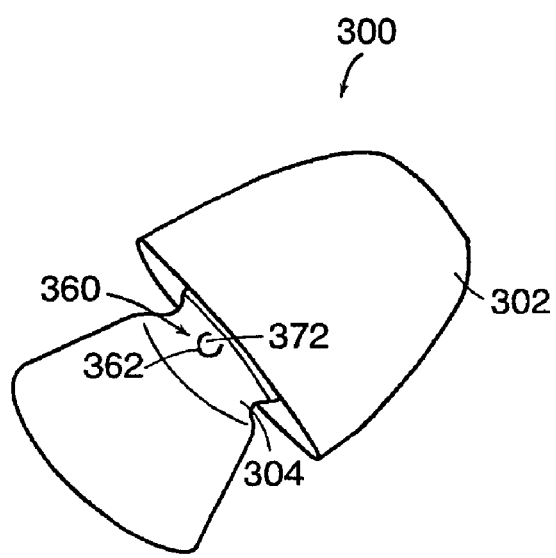
FIGS. 47A–B and FIGS. 48A–48C illustrate a flap valve formed in a flexible tip.
Figure 47B:
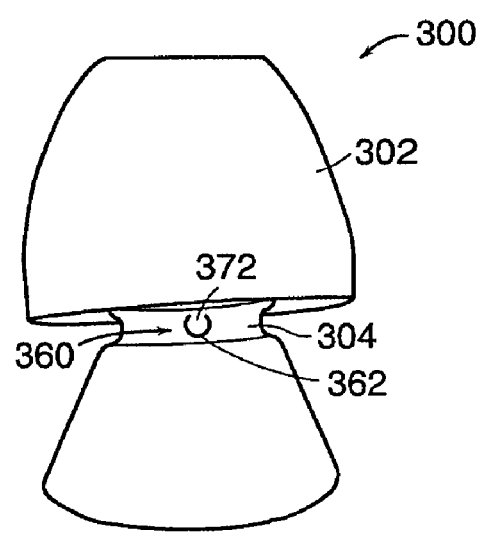

FIGS. 47A and 47B show a tip 300 having at least one valve 362 formed on the sound port 304 over an aperture in the sound port 304. Preferably, the valve 362 is formed as a flap from the same material as the tip 300. The valve 362 can rotate about a hinge joint 372 formed in the tip 300. The valve 362 can rotate either toward or away from a bore 316 in the sound port 304 to equalize pressure.

Figure 48A:
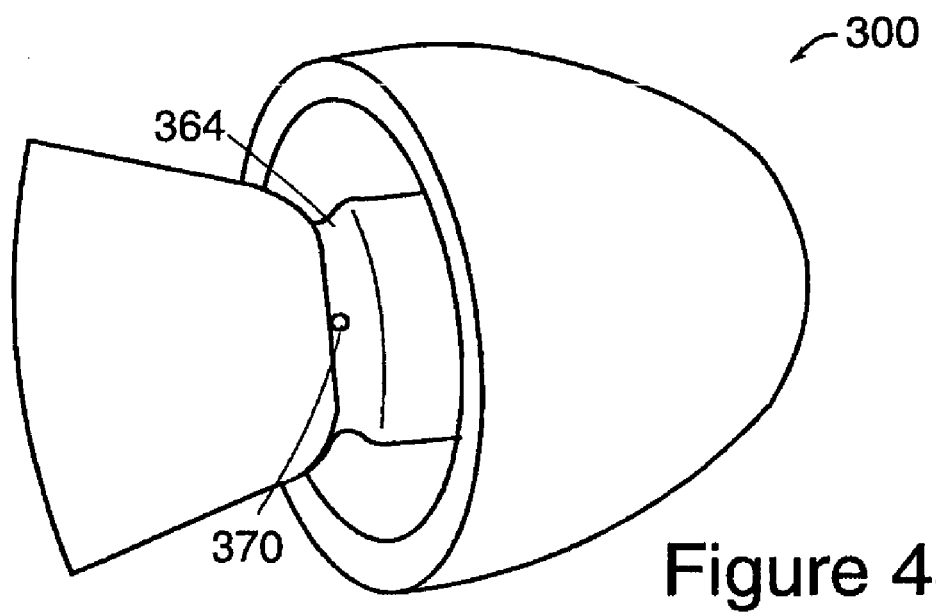
Figure 48B:
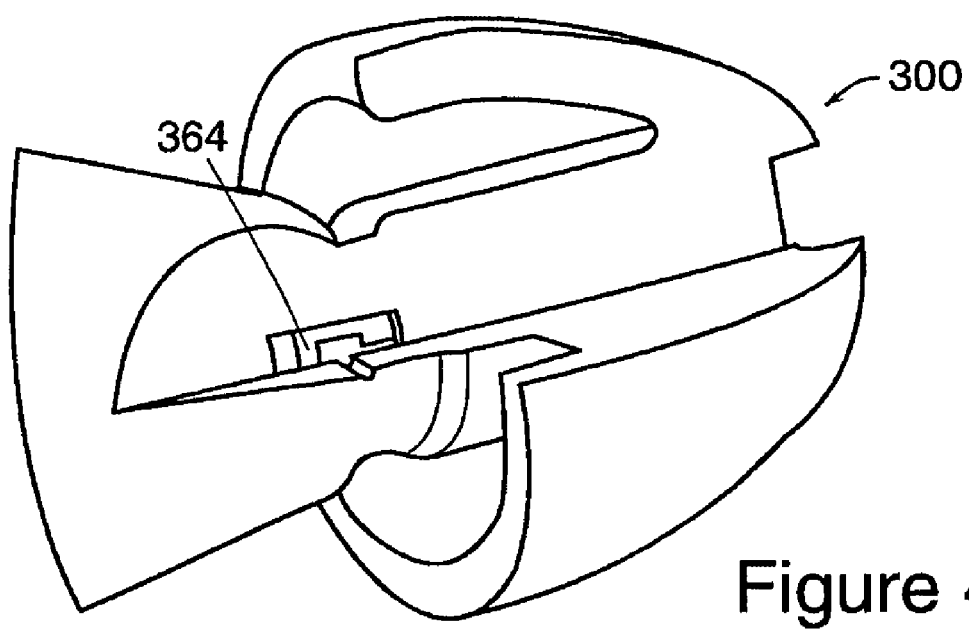
Figure 48C:
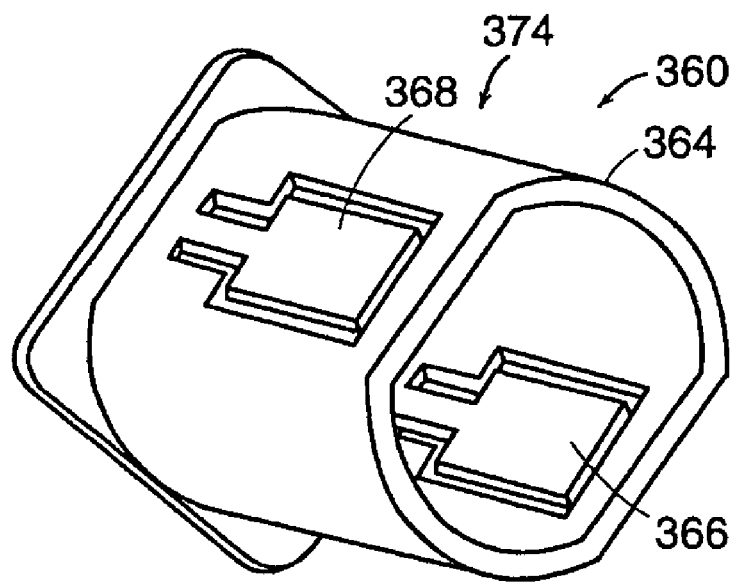

FIGS. 48A–48C illustrate a valve 360 mounted within a tip 300. FIG. 48C illustrates the valve 360 as an internal hinge valve 364 having a hinge portion 374. The hinge portion 374 can include a first hinge portion 366 and a second hinge portion 368. The internal hinge valve 364 is molded within the sound port 304 of the flexible tip 300, as shown in FIG. 48B. FIG. 48A shows at least one aperture 370 is located in the sound port 304 in alignment with the hinge portion 374, thereby allowing air to enter or exit the sound port 304 and move the hinge portion 374 to equalize pressure. The internal hinge valve 364 can be mounted to a receiver 328 to allow fro ease of assembly.

The tip 300 can also be formed of a porous or open-cell material, such as an open-cell foam, for example. The open-cell material can attenuate sound while allowing the transfer of air through its porous structure, thereby allowing for pressure equalization.

The design of the flexible tip 300 can also be modified to allow increased flexibility in the tip 300 such that the tip distorts when removed from an ear canal, thereby allowing rapid pressure equalization.

Figure 50:
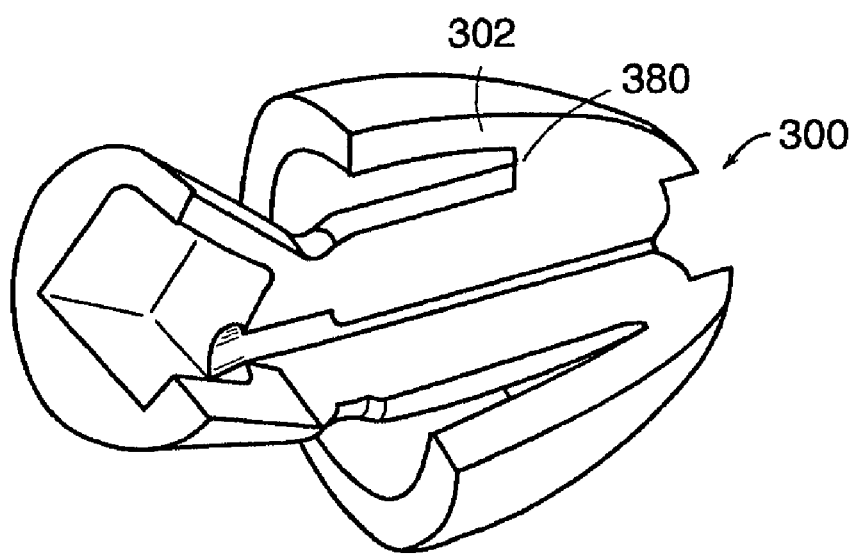
Figure 51:
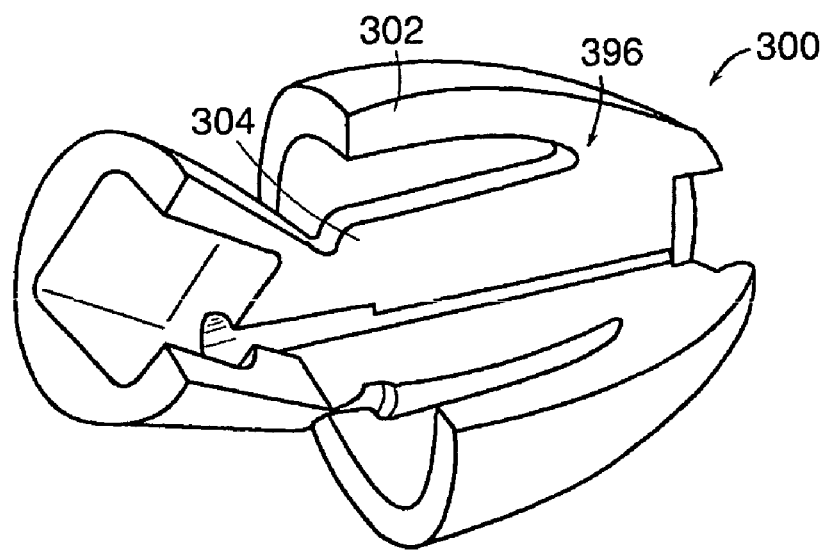

FIG. 50 illustrates a flexible tip 300 having a partial rib portion 380. FIG. 51 shows a flexible tip 300 without a rib portion 308 located between the mushroom shaped tip 302 and the sound port 304. In these embodiments, the proximal portion of the tip portion 302 is attached to a proximal portion 396 of the sound port 304. Reducing or eliminating the rib 308 in the tip 300 allows partial or complete inversion of the mushroom shaped tip 302 during removal from an ear canal. The inversion can decrease the pressure differential created during the removal process.

Figure 52:
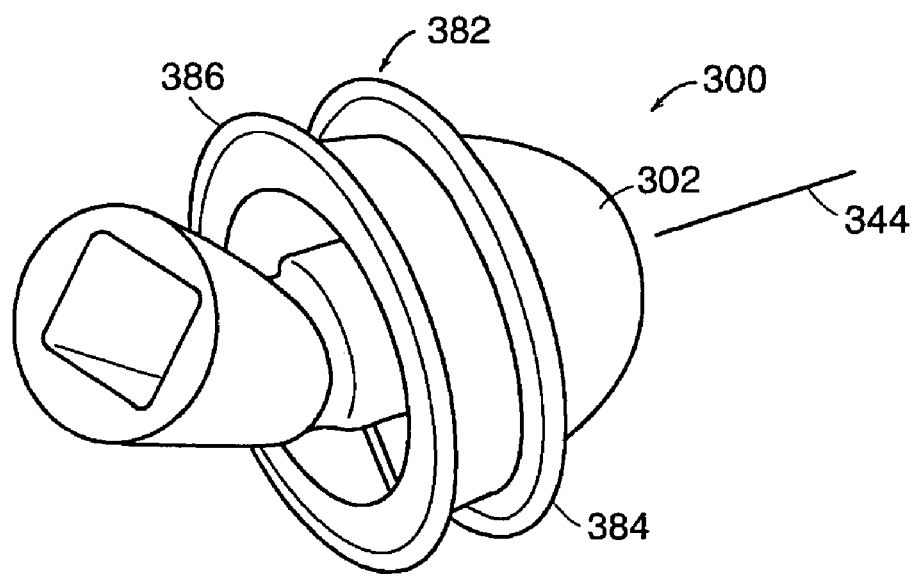

At least one protrusion 382 can be located on the surface of the mushroom shaped tip 302, shown in FIG. 52, in order to distort the tip 300 as it is removed from an ear canal. Preferably, the protrusion 382 is located about the circumference of the tip 302. The protrusion 382 can include a first ring 384 and a second ring 386 which create a seal with an ear canal. As the tip 300 is removed from the ear canal, the rings 384 collapse toward the longitudinal axis 344 of the tip 300, thereby breaking the seal with the ear canal and equalizing the pressure.

Figure 53:
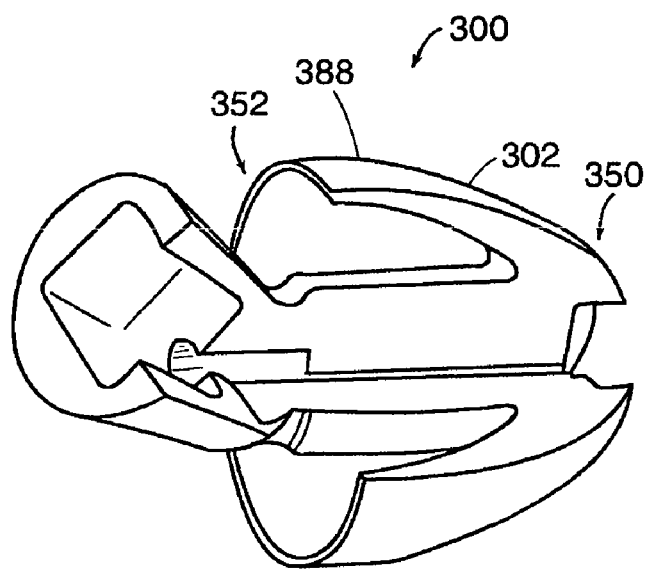

The flexible tip 300 can also be modified such that the distal end 352 of the mushroom shaped tip 302 includes a decreased thickness portion 388, shown in FIG. 53. The decreased thickness portion 388 is located about the circumference of the mushroom shaped tip 302 and can be approximately 20 mils thick. Preferably, the thickness of the mushroom shaped tip 302 decreases from the proximal end 350 toward the distal end 352. The decreased thickness portion 388 allows a partial or complete inversion of the mushroom shaped tip 302 during removal from an ear canal. The inversion can decrease the pressure differential created during the removal process. The use of a decreased thickness portion 388 does not adversely affect the acoustical attenuation of the tip 300.

Figure 54A:
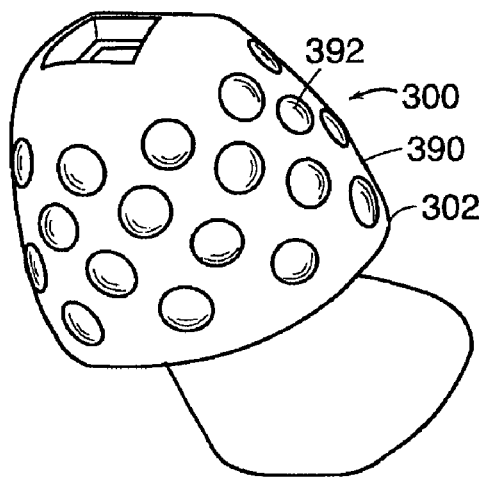
Figure 54B:
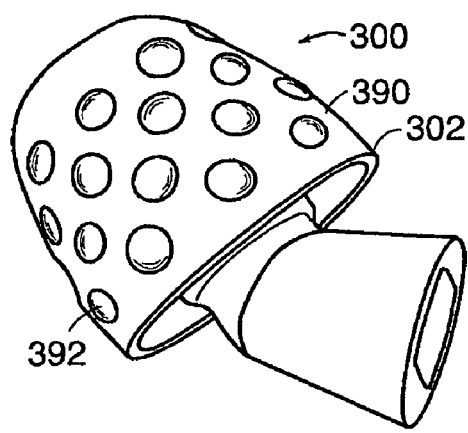

The flexible tip 300 can also be designed such that a minimal contact surface 390 exists between the mushroom shaped tip 302 and an ear canal. FIGS. 54A and 54B illustrate a tip 300 having a minimal contact surface 390. In this embodiment, circular indentations 392 are formed in the mushroom shaped tip 302 such that, when inserted into an ear canal, the non-indented portion of the mushroom shaped tip 302 contacts the ear canal. With a minimal contact surface 390, the mushroom shaped tip 302 can more easily break a seal with the ear canal to equalize air the pressure.

While this invention has been particularly shown and described with references to preferred embodiments thereof, it will be understood by those skilled in the art that various changes in form and details may be made therein without departing from the scope of the invention encompassed by the appended claims.

What is claimed is:

1. A hearing aid comprising:
  a first half shell;
  a second half shell attached to the first half shell to form a housing that conforms to the shape of an ear canal;
  a microphone, a battery, and electronics mounted within the housing formed by the first half shell and the second half shell;
  a mechanical securing mechanism located on the first half shell and the second half shell, the securing mechanism attaching the first half shell to the second half shell; and
  a flexible tip attached to the housing formed by the first half shell and the second half shell.

2. The hearing aid of claim 1 wherein the securing mechanism comprises an interlocking joint.

3. The hearing aid of claim 1 further comprising an aperture to allow a potting material to be introduced into the hearing aid, the potting material minimizing acoustic and mechanical feedback created by one or more components in the hearing aid.

4. The hearing aid of claim 1 further comprising a microphone retainer to secure the microphone against a faceplate of the hearing aid, the microphone retainer minimizing the space formed between the microphone and the faceplate, thereby reducing resonances in the acoustic frequency response of the hearing aid.

5. The hearing aid of claim 4 wherein the microphone retainer comprises a protrusion formed within the first half shell and the second half shell.

6. The hearing aid of claim 1 wherein the flexible tip comprises a mushroom shaped tip.

7. The hearing aid of claim 1 wherein the flexible tip comprises an isolation nest, a receiver being mounted within the isolation nest.

8. The hearing aid of claim 1 wherein the hearing aid is an in-the-canal hearing aid.

9. The hearing aid of claim 1 further comprising an adhesive seal formed between the first half shell and the second half shell.

10. The hearing aid of claim 1 wherein the battery is substantially permanently affixed within the housing formed by the first half shell and the second half shell.

* * * * *